(12) United States Patent
Lee et al.

(10) Patent No.: US 12,295,220 B2
(45) Date of Patent: May 6, 2025

(54) DISPLAY DEVICE

(71) Applicant: Samsung Display Co., Ltd., Yongin-Si (KR)

(72) Inventors: Jun Hee Lee, Hwaseong-si (KR); Nak Cho Choi, Yongin-si (KR); Min Yeul Ryu, Suwon-si (KR); Dong Ki Lee, Seongnam-si (KR); Choong Youl Im, Yongin-si (KR); Beohm Rock Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 202 days.

(21) Appl. No.: 17/154,922

(22) Filed: Jan. 21, 2021

(65) Prior Publication Data
US 2022/0077269 A1    Mar. 10, 2022

(30) Foreign Application Priority Data
Sep. 9, 2020    (KR) ........................ 10-2020-0115379

(51) Int. Cl.
*H10K 59/131*    (2023.01)
*H10K 50/844*    (2023.01)
(Continued)

(52) U.S. Cl.
CPC ......... *H10K 59/131* (2023.02); *H10K 50/844* (2023.02); *H10K 59/122* (2023.02); *H10K 59/126* (2023.02); *H10K 59/38* (2023.02)

(58) Field of Classification Search
CPC ............. H01L 51/5253; H01L 27/3246; H01L 27/3258; H01L 27/1225; H01L 27/3276;
(Continued)

(56) References Cited

U.S. PATENT DOCUMENTS

| 10,658,439 B2 | 5/2020 | Hanari |
| 2011/0227896 A1* | 9/2011 | Hwang ................ H10K 59/124 |
| | | 345/82 |

(Continued)

FOREIGN PATENT DOCUMENTS

| JP | 2016-048286 A | 4/2016 |
| JP | 2018-074076 A | 5/2018 |

(Continued)

*Primary Examiner* — Vongsavanh Sengdara
(74) *Attorney, Agent, or Firm* — Innovation Counsel LLP

(57) ABSTRACT

A display device includes a substrate, a transistor, an interlayer insulating layer, a first conductive line, a pixel electrode, a passivation layer, a common electrode, and a light emitting element layer. The transistor overlaps the substrate. The interlayer insulating layer overlaps the transistor and includes a first groove. The first conductive line is electrically connected to the transistor and is at least partially disposed inside the first groove. The pixel electrode is electrically connected to the transistor and overlaps the first conductive line. The passivation layer is disposed between the pixel electrode and the first conductive line and directly contacts at least one of the pixel electrode and the first conductive line. The common electrode overlaps the pixel electrode. The light emitting element layer is disposed between the common electrode and the pixel electrode.

11 Claims, 25 Drawing Sheets

(51) Int. Cl.
*H10K 59/122* (2023.01)
*H10K 59/126* (2023.01)
*H10K 59/38* (2023.01)

(58) Field of Classification Search
CPC .............. H01L 27/322; H01L 27/3272; H01L 2251/558; H10K 50/844; H10K 59/126; H10K 59/122; H10K 59/38; H10K 59/131

See application file for complete search history.

(56) References Cited

U.S. PATENT DOCUMENTS

| | | | |
|---|---|---|---|
| 2017/0331058 A1* | 11/2017 | Seo | H10K 50/8445 |
| 2018/0006106 A1* | 1/2018 | Oh | H10K 59/1216 |
| 2018/0342564 A1* | 11/2018 | Hanari | H10K 59/8722 |
| 2019/0189718 A1* | 6/2019 | Lee | H10K 59/8731 |
| 2019/0198782 A1* | 6/2019 | Kim | H01L 27/1248 |
| 2019/0214587 A1* | 7/2019 | Kim | G09F 9/301 |
| 2019/0245017 A1* | 8/2019 | Jeon | H10K 59/126 |
| 2019/0259822 A1* | 8/2019 | Jeon | H01L 27/1218 |
| 2020/0051966 A1* | 2/2020 | Lee | H10K 59/131 |
| 2020/0119058 A1* | 4/2020 | Shin | H01L 27/1218 |
| 2020/0243635 A1 | 7/2020 | Lee et al. | |
| 2020/0328260 A1* | 10/2020 | Tang | H10K 59/60 |

FOREIGN PATENT DOCUMENTS

| | | |
|---|---|---|
| JP | 6665888 B2 | 3/2020 |
| KR | 10-2016-0076688 A | 7/2016 |
| KR | 10-2018-0025104 A | 3/2018 |
| KR | 10-2018-0093192 A | 8/2018 |
| KR | 10-2018-0125674 A | 11/2018 |
| KR | 10-2019-0096472 A | 8/2019 |
| KR | 10-2020-0006647 A | 1/2020 |
| KR | 10-2020-0119946 A | 10/2020 |

* cited by examiner

DISPLAY DEVICE

CROSS-REFERENCE TO RELATED APPLICATION

This application claims priority to and the benefit of Korean Patent Application No. 10-2020-0115379 filed in the Korean Intellectual Property Office on Sep. 9, 2020; the Korean Patent Application is incorporated by reference.

BACKGROUND

1. Field

The technical field relates to a display device.

2. Description of the Related Art

A display device may display images according to input signals. Modern display devices include liquid crystal display (LCD) devices and organic light emitting diode (OLED) display devices. Display devices may be included in various electronic devices, such as mobile phones, navigation devices, digital cameras, electronic books, and portable game machines.

Typically, external light incident on an OLED display device may be reflected on one or more internal surfaces of the OLED display device, undesirably reducing contrast of displayed images. As a result, the image display quality of the OLED display device may be unsatisfactory.

SUMMARY

Embodiments may be related a display device with satisfactory image contrast and with satisfactory transmittance. Structures in the display device may minimize undesirable reflection of external light. An embodiment may be related to a display device that includes the following elements: a substrate; a transistor on the substrate; an interlayer insulating layer on the transistor; a driving voltage line and a data line that are on the interlayer insulating layer, and are connected to the transistor; a passivation layer on the driving voltage line and the data line; a pixel electrode that is on the passivation layer and overlaps at least a portion of the driving voltage line and the data line; a pixel defining layer that is on the pixel electrode and includes a pixel opening; a light emitting element layer on the pixel electrode; and a common electrode on the light emitting element layer and the pixel defining layer, wherein the interlayer insulating layer may include a groove, and the driving voltage line and the data line are disposed in the groove.

The interlayer insulating layer may include a first groove and a second groove, the driving voltage line may be in the first groove, and the data line may be in the second groove.

A depth of the first groove may be the same as a thickness of the driving voltage line, and a depth of the second groove may be the same as a thickness of the data line.

A width of the first groove may be greater than or equal to that of the driving voltage line, and a width of the second groove may be greater than or equal to that of the data line.

The display device may include a plurality of data lines spaced apart from each other, and at least two of the plurality of data lines may be disposed in the second groove.

One data line may be disposed in the second groove.

The interlayer insulating layer may include a lower interlayer insulating layer and an upper interlayer insulating layer disposed on the lower interlayer insulating layer, the lower interlayer insulating layer may be entirely disposed above the substrate, and a portion in which the upper interlayer insulating layer may be eliminated becomes the groove.

A bottom surface of the groove may be in contact with an upper surface of the lower interlayer insulating layer, and a side surface of the groove may be in contact with a side surface of the upper interlayer insulating layer.

The display device may include a plurality of driving voltage lines spaced apart from each other, and at least two of the plurality of driving voltage lines may be disposed in the groove.

The display device may further include an encapsulation layer on the common electrode, a touch part on the encapsulation layer, and an anti-reflection part on the touch part, wherein the anti-reflection part may include a light blocking layer overlapping the pixel defining layer, and a color filter overlapping the pixel electrode.

Each pixel of the display device may include a plurality of transistors, and the plurality of transistors may include an oxide transistor including an oxide semiconductor and a polycrystalline transistor including a polycrystalline semiconductor.

An embodiment may be related to a display device that includes the following elements: a substrate; a transistor on the substrate; an interlayer insulating layer on the transistor; a driving voltage line and a data line that are on the interlayer insulating layer, and are connected to the transistor; a passivation layer on the driving voltage line and the data line; a pixel electrode that is on the passivation layer and overlaps at least a portion of the driving voltage line and the data line; a pixel defining layer that is on the pixel electrode and includes a pixel opening; a light emitting element layer on the pixel electrode; and a common electrode on the light emitting element layer and the pixel defining layer, wherein the passivation layer may include a first passivation layer and a second passivation layer disposed on the first passivation layer, and the second passivation layer may be disposed in some region on the substrate and overlap the driving voltage line and the data line.

The first passivation layer may be entirely disposed above the substrate, the second passivation layer may overlap the pixel electrode, the pixel electrode is disposed on the second passivation layer, and the second passivation layer may overlap an edge of the pixel defining layer and does not overlap a center portion of the pixel defining layer.

The first passivation layer and the second passivation layer may include an organic insulating material.

The passivation layer may further include a third passivation layer disposed below the first passivation layer, and the third passivation layer may include an inorganic insulating material.

The first passivation layer and the third passivation layer may be entirely disposed on the substrate.

The third passivation layer may be entirely disposed on the substrate, and the first passivation layer may be disposed in some region on the substrate and overlaps the driving voltage line and the data line.

An embodiment may be related to a display device that includes the following elements: a substrate; a transistor on the substrate; an interlayer insulating layer on the transistor; a driving voltage line and a data line that are on the interlayer insulating layer, and are connected to the transistor; a passivation layer on the driving voltage line and the data line; a pixel electrode that is on the passivation layer and overlaps at least a portion of the driving voltage line and the data line; a pixel defining layer that is on the pixel electrode and includes a pixel opening; a light emitting element layer on the pixel electrode; and a common electrode on the light emitting element layer and the pixel defining layer, wherein the passivation layer may include a first portion overlapping the driving voltage line and the data line and a second portion excluding the first portion, and a thickness of the first portion may be thicker than that of the second portion.

The first portion of the passivation layer may overlap the pixel electrode, may overlap an edge of the pixel defining layer, and may not overlap a center portion of the pixel defining layer.

The passivation layer may include an organic insulating material.

An embodiment may be related to a display device. The display device may include a substrate, a transistor, an interlayer insulating layer, a first conductive line, a pixel electrode, a passivation layer, a common electrode, and a light emitting element layer. The transistor may overlap the substrate. The interlayer insulating layer may overlap the transistor and may include a first groove. The first conductive line may be electrically connected to the transistor and may be at least partially disposed inside the first groove. The pixel electrode may be electrically connected to the transistor and may overlap the first conductive line. The passivation layer may be disposed between the pixel electrode and the first conductive line and may directly contact at least one of the pixel electrode and the first conductive line. The common electrode may overlap the pixel electrode. The light emitting element layer may be disposed between the common electrode and the pixel electrode.

The display device may include a first data line. The interlayer insulating layer may include a second groove. The first conducive line may be a driving voltage line. The first data line may be at least partially disposed inside the second groove.

A maximum depth of the first groove may be equal to a maximum thickness of the driving voltage line in a thickness direction of the driving voltage line. A maximum depth of the second groove may be equal to a maximum thickness of the first data line in a thickness direction of the first data line.

A maximum width of the first groove may be greater than or equal to a maximum width of the driving voltage line in a cross section of the display device. A maximum width of the second groove may be greater than or equal to a maximum width of the first data line in the cross section of the display device.

The display device may include a second data line. The second data line may be spaced from the first data line and may be at least partially disposed inside the second groove.

Exactly one data line may be disposed in the second groove.

The interlayer insulating layer may include a first insulating layer and a second insulating layer. The first insulating layer may be disposed between the second insulating layer and the substrate. The first conductive line may directly contact a face of the first insulating layer and may be disposed between two sections of the second insulating layer.

The face of the first insulating layer may directly contact the two sections of the second insulating layer.

The display device may include a driving voltage line. The driving voltage line may be spaced from the first conductive line and may be at least partially disposed inside the first groove.

The display device may include the following elements: an encapsulation layer overlapping the common electrode; a light blocking layer overlapping the encapsulation layer; and a color filter overlapping the pixel electrode and directly contacting the light blocking layer.

The transistor may include at least one of an oxide semiconductor and a polycrystalline semiconductor.

An embodiment may be related to a display device. The display device may include the following elements: a substrate; a transistor overlapping the substrate; a first conductive line overlapping the substrate and electrically connected to the transistor; a pixel electrode overlapping the first conductive line and electrically connected to the transistor; a pixel defining layer including an opening, wherein the opening may at least partially expose the pixel electrode and may be disposed between a first section of the pixel defining layer and a second section of the pixel defining layer; a common electrode overlapping the pixel electrode; a light emitting element layer disposed between the pixel electrode and the common electrode; a first passivation layer disposed between the first conductive line and the pixel electrode; and a second passivation layer disposed between the first passivation layer and the pixel electrode, directly contacting at least one of the first passivation layer and the pixel electrode, overlapping the first conductive line, and exposing a portion of the first passivation layer, wherein the first section of the pixel defining layer may overlap the portion of the first passivation layer.

Two opposite faces of the second passivation layer may respectively directly contact the first section of the pixel defining layer and the second section of the pixel defining layer.

At least one of the first passivation layer and the second passivation layer may include an organic insulating material.

The display device may include a third passivation layer disposed between the first conductive line and the first passivation layer. The third passivation layer may include an inorganic insulating material.

The first passivation layer and the third passivation layer may cover an entire face of the substrate.

The first passivation layer may expose a portion of the third passivation layer. The first section of the pixel defining layer may overlap the portion of the third passivation layer.

An embodiment may be related to a display device. The display device may include the following elements: a substrate; a transistor overlapping the substrate; a first conductive line overlapping the substrate and electrically connected to the transistor; a pixel electrode overlapping the first conductive line and electrically connected to the transistor; a common electrode overlapping the pixel defining layer; a light emitting element layer disposed between the pixel electrode and the common electrode; and a passivation layer. A first face of the passivation layer may be disposed between the first conductive line and the pixel electrode, may overlap the first conductive line, may overlap the pixel electrode, and may be farther from the substrate than a second face of the passivation layer is. The second face of the passivation layer may be opposite a third face of the passivation layer. The third face of the passivation layer may be disposed between the substrate and the second face of the passivation layer.

The display device may include a pixel defining layer partially exposing the pixel electrode. An edge of the pixel defining layer may be disposed between two opposite edges of the first face of the passivation layer.

The passivation layer may include an organic insulating material.

According to embodiments, structures of a display device may substantially prevent external light from being reflected by elements inside the display device and viewed by a user of the display device. Advantageously, satisfactory image display quality may be attained.

DETAILED DESCRIPTION

Figure 1:
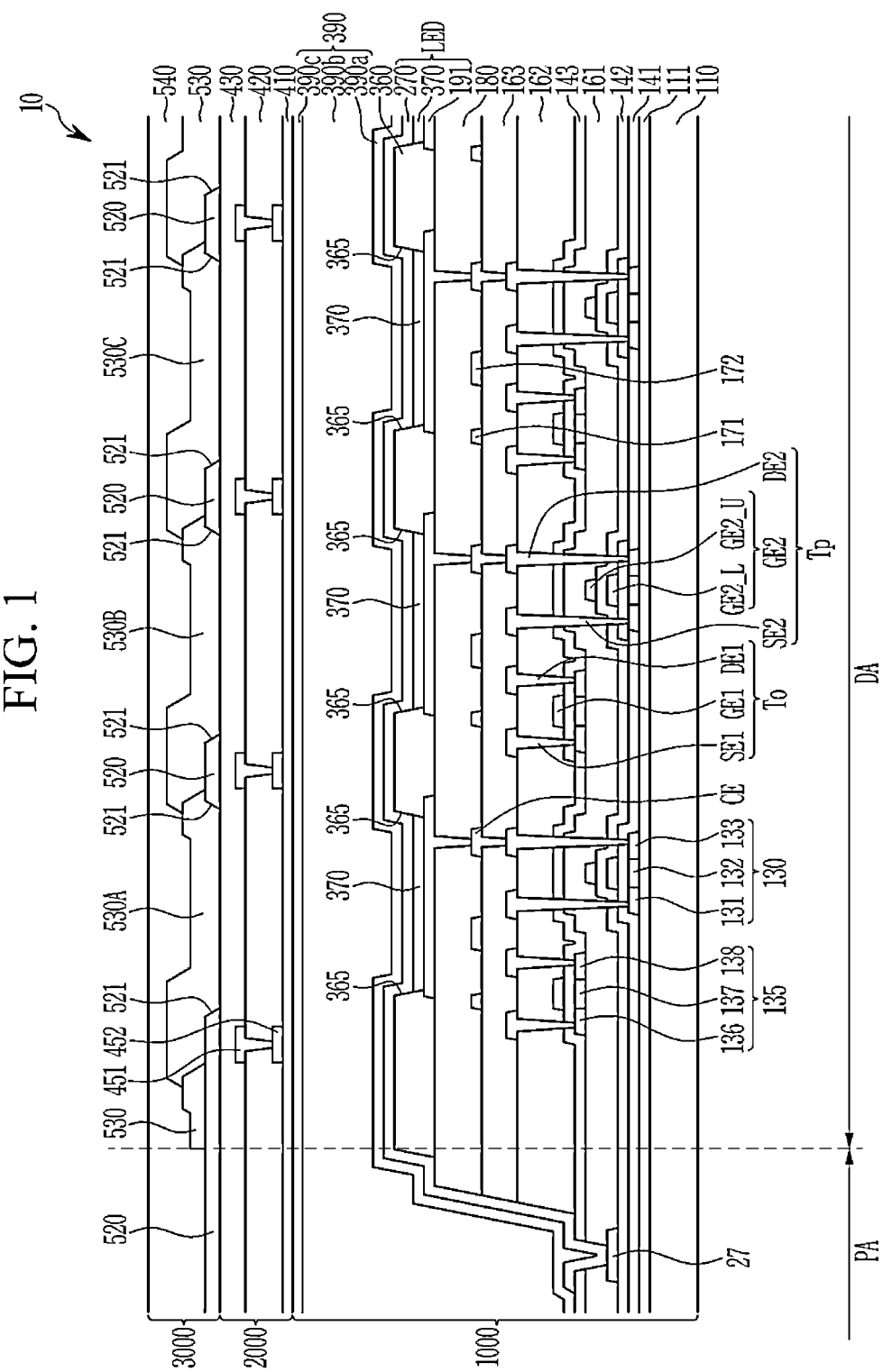
FIG. 1 illustrates a cross-sectional view of a display device according to an embodiment.

Example embodiments are described with reference to the accompanying drawings. The described embodiments may be modified in various ways.

In the application, identical or similar elements may be denoted by the same reference numerals or identifiers.

In the drawings, dimensions may be exaggerated for clarity.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and the second element. The word "on" or "above" may mean positioned (or disposed) on or below an object, and does not necessarily mean positioned (or disposed) on the upper side of the object based on a gravitational direction.

Unless explicitly described to the contrary, the word "comprise" and variations such as "comprises" or "comprising" may indicate the inclusion of stated elements but not the exclusion of any other elements.

The term "connect" may mean "electrically connect" or "electrically connected through no intervening transistor." The term "insulate" may mean "electrically insulate" or "electrically isolate." The term "conductive" may mean "electrically conductive." The term "drive" may mean "operate" or "control." The term "the same as" may mean "equal to." The expression "be entirely disposed" may mean "(substantially) cover an entire face of" or "(substantially) cover an area." The expression that an opening overlaps an object may mean that the opening exposes the object or a position of the opening overlaps a position of the object. A listing of materials may mean at least one of the listed materials.

FIG. 1 illustrates a cross-sectional view of a display device 10 according to an embodiment.

Referring to FIG. 1, the display device 10 includes a display part 1000, a touch part 2000, and an anti-reflection part 3000. The touch part 2000 may be disposed between the display part 1000 and the anti-reflection part 3000. The display device 10 may include a display area DA and a non-display area PA.

The display part 1000 may include a substrate 110, and a buffer layer 111 may be disposed on the substrate 110.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may be a rigid substrate, or a flexible substrate that is bendable, foldable, or rollable. The buffer layer 110 may be single-layered or multi-layered. The substrate 110 may include base layers, inorganic layers, and/or polymer resin layers that are sequentially stacked and/or alternately stacked.

The buffer layer 111 may be disposed between the substrate 110 and a second semiconductor 130 to block impurities from the substrate 110 during a crystallization process of forming polycrystalline silicon to improve characteristics of the polycrystalline silicon. The buffer layer 111 may provide a flat surface over the substrate 110 to reduce stress of the second semiconductor 130 formed on the buffer layer 111.

The buffer layer 111 may include an inorganic insulating material such as a silicon oxide ($SiO_x$), a silicon nitride ($SiN_x$), and a silicon oxynitride ($SiO_xN_y$). The buffer layer 111 may include amorphous silicon (a-Si).

Although not illustrated, a barrier layer may be further disposed between the substrate 110 and the buffer layer 111. The barrier layer may have a single-layered or multi-layered structure. The barrier layer may include an inorganic insulating material such as a silicon oxide, a silicon nitride, and a silicon oxynitride.

The second semiconductor 130 may be disposed on the buffer layer 111. The second semiconductor 130 may include a polycrystalline silicon material. That is, the second semiconductor 130 may be formed of a polycrystalline semiconductor. The second semiconductor 130 may include a source region 131, a channel region 132, and a drain region 133.

The source region 131 of the second semiconductor 130 may be connected to a second source electrode SE2, and the drain region 133 of the second semiconductor 130 may be connected to a second drain electrode DE2.

A first gate insulating layer 141 may be disposed on the second semiconductor 130. The first gate insulating layer 141 may have a single-layered or multi-layered structure including a silicon nitride, a silicon oxide, a silicon oxynitride, and the like.

A second gate lower electrode GE2_L may be disposed on the first gate insulating layer 141. The second gate lower electrode GE2_L may include molybdenum (Mo), aluminum (Al), copper (Cu), and/or titanium (Ti), and may have a single-layered or multi-layered structure including them.

A second gate insulating layer 142 may be disposed on the second gate lower electrode GE2_L. The second gate insulating layer 142 may include a silicon nitride, a silicon oxide, a silicon oxynitride, and the like. The second gate insulating layer 142 may have a single-layered or multi-layered structure including a silicon nitride, a silicon oxide, a silicon oxynitride, and the like.

A second gate upper electrode GE2_U may be disposed on the second gate insulating layer 142. The second gate lower electrode GE2_L and the second gate upper electrode GE2_U may overlap each other with the intervening second gate insulating layer 142. The second gate upper electrode GE2_U and the second gate lower electrode GE2_L form a second gate electrode GE2. The second gate electrode GE2 may overlap the channel region 132 of the second semiconductor 130 in a direction perpendicular to the substrate 110.

The second gate upper electrode GE2_U and a gate line GL may include molybdenum (Mo), aluminum (Al), copper (Cu) silver (Ag), chromium (Cr), tantalum (Ta), or titanium (Ti), and may have a single-layered or multi-layered structure including them.

Although not shown, a metal blocking layer BML formed of the same layer as the second gate upper electrode GE2_U and the gate line GL may be disposed on the second gate insulating layer 142, and the metal blocking layer BML may overlap an oxide transistor To.

The second semiconductor 130, the second gate electrode GE2, the second source electrode SE2, and the second drain electrode DE2 form a polycrystalline transistor Tp. The polycrystalline transistor Tp may be a driving transistor connected to a light emitting diode LED, and may be formed as a transistor including a polycrystalline semiconductor.

A first interlayer insulating layer 161 may be disposed on the second gate electrode GE2. The first interlayer insulating layer 161 may include a silicon nitride, a silicon oxide, a silicon oxynitride, or the like. The first interlayer insulating layer 161 may have a multilayer structure in which a layer containing a silicon oxide and a layer containing a silicon nitride are stacked. The layer containing a silicon nitride may be disposed closer to the substrate 110 than the layer containing a silicon oxide in the first interlayer insulating layer 161.

A first semiconductor 135 may be disposed on the first interlayer insulating layer 161. The first semiconductor 135 may overlap the metal blocking layer BML.

The first semiconductor 135 may include an oxide semiconductor. For example, the first semiconductor 135 may include an indium-gallium-zinc oxide (IGZO).

The first semiconductor 135 may include a channel region 137, and a source region 136 and a drain region 138 disposed at respective sides of the channel region 137. The source region 136 of the first semiconductor 135 may be connected to a first source electrode SE1, and the drain region 138 of the first semiconductor 135 may be connected to a first drain electrode DE1.

A third gate insulating layer 143 may be disposed on the first semiconductor 135. The third gate insulating layer 143 may include a silicon nitride, a silicon oxide, a silicon oxynitride, or the like.

The third gate insulating layer 143 (except contact holes) may be entirely disposed on the first semiconductor 135 and the first interlayer insulating layer 161. Accordingly, the third gate insulating layer 143 covers upper and lateral surfaces of the source region 136, the channel region 137, and the drain region 138 of the first semiconductor 135.

In a process of implementing high resolution, a size of each pixel decreases, and accordingly, a length of the semiconductor channel decreases. If the third gate insulating layer 143 does not cover the upper surfaces of the source region 136 and the drain region 138, some material of the first semiconductor 135 may move to the lateral surface of the third gate insulating layer 143. In an embodiment, since the third gate insulating layer 143 is disposed on the entire surface of the first semiconductor 135 and the first interlayer insulating layer 161, a short circuit between the first semiconductor 135 and the first gate electrode GE1 due to diffusion of metal particles may be prevented.

The third gate insulating layer 143 may not be disposed on the entire surface of the first semiconductor 135 and the first interlayer insulating layer 161. For example, the third gate insulating layer 143 may be disposed only between the first gate electrode GE1 and the first semiconductor 135. That is, the third gate insulating layer 143 may overlap the channel region 137 of the first semiconductor 135, and may not overlap the source region 136 and the drain region 138.

A first gate electrode GE1 may be disposed on the third gate insulating layer 143.

The first gate electrode GE1 may overlap the channel region 137 of the first semiconductor 135 in a direction perpendicular to the substrate 110. The first gate electrode GE1 may include molybdenum (Mo), aluminum (Al), copper (Cu), and/or titanium (Ti), and may have a single-layered or multi-layered structure including them. For example, the first gate electrode GE1 may include a lower layer containing titanium and an upper layer containing molybdenum, and the lower layer containing titanium may prevent diffusion of fluorine (F), which is an etching gas, during dry-etching of the upper layer.

The first semiconductor 135, the first gate electrode GE1, the first source electrode SE1, and the first drain electrode DE1 form an oxide transistor To. The oxide transistor To may be a switching transistor for switching the polycrystalline transistor Tp, and may include an oxide semiconductor.

A second interlayer insulating layer 162 may be disposed on the first gate electrode GE1. The second interlayer insulating layer 162 may include a silicon nitride, a silicon oxide, a silicon oxynitride, or the like. The second interlayer insulating layer 162 may be have a multilayer structure in which a layer containing a silicon nitride and a layer containing a silicon oxide are stacked.

The first source electrode SE1 and the first drain electrode DE1, and the second source electrode SE2 and the second drain electrode DE2, may be disposed on the second interlayer insulating layer 162. The first source electrode SE1, the first drain electrode DE1, the second source electrode SE2, and the second drain electrode DE2 may include molybdenum (Mo), chromium (Cr), tantalum (Ta), aluminum (Al), silver (Ag), magnesium (Mg), gold (Au), nickel (Ni), calcium (Ca), titanium (Ti), tungsten (W), and/or copper (Cu), and may have a single-layered or multi-layered structure including them. For example, the first source electrode SE1, the first drain electrode DE1, the second source electrode SE2, and the second drain electrode DE2 may have a triple-layered structure that includes a lower layer containing a refractory metal such as molybdenum, chromium, tantalum, and titanium, or an alloy thereof, an interlayer containing an aluminum-based metal, a silver-based metal, and a copper-based metal with low resistivity, and an upper layer containing a refractory metal such as molybdenum, chromium, tantalum, and titanium.

The first source electrode SE1 may be connected to the source region 136 of the first semiconductor 135, and the first drain electrode DE1 may be connected to the drain region 138 of the first semiconductor 135.

The second source electrode SE2 may be connected to the source region 131 of the second semiconductor 130, and the second drain electrode DE2 may be connected to the drain region 133 of the second semiconductor 130.

A third interlayer insulating layer 163 may be disposed on the first source electrode SE1, the first drain electrode DE1, the second source electrode SE2, and the second drain electrode DE2. The third interlayer insulating layer 163 may be an organic layer. For example, the third interlayer insulating layer 163 may include an organic insulating material such as a general purpose polymer such as poly(methylmethacrylate) (PMMA) or polystyrene (PS), a polymer derivative having a phenolic group, a acryl-based polymer, an imide-based polymer, a polyimide, an acryl-based polymer, and a siloxane-based polymer.

A connection electrode CE, a data line 171, and a driving voltage line 172 may be disposed on the third interlayer insulating layer 163. The connection electrode CE and a data line DL may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including them.

The connection electrode CE is connected to the second drain electrode DE2.

A passivation layer 180 may be disposed on the third interlayer insulating layer 163, the connection electrode CE, and the data line DL. The passivation layer 180 may eliminate or flatten a step to increase light emitting efficiency of a light emitting element to be formed thereon. The passivation layer 180 may include an organic insulating material such as a general purpose polymer such as poly (methylmethacrylate) (PMMA) or polystyrene (PS), a polymer derivative having a phenolic group, an acryl-based polymer, an imide-based polymer, a polyimide, an acryl-based polymer, and a siloxane-based polymer.

A pixel electrode 191 may be disposed on the passivation layer 180. The pixel electrode 191 may be connected to the second drain electrode DE2 through a contact hole of the passivation layer 180.

A pixel electrode 191 may be provided for each pixel PX. The pixel electrode 191 may contain a metal such as silver (Ag), lithium (Li), calcium (Ca), aluminum (Al), magnesium (Mg), or gold (Au), and may contain a transparent conductive oxide (TCO) such as an indium tin oxide (ITO) or an indium zinc oxide (IZO). The pixel electrode 191 may be a single layer including a metal material or a transparent conductive oxide, or a multilayer structure. For example, the pixel electrode 191 may have a triple-layered structure of an indium tin oxide (ITO) layer, a silver (Ag) layer, and an indium tin oxide (ITO) layer that are sequentially stacked.

A pixel defining layer 360 may be disposed on the pixel electrode 191. The pixel defining layer 360 may include an organic insulating material such as a general purpose polymer such as poly(methylmethacrylate) (PMMA) or polystyrene (PS), a polymer derivative having a phenolic group, an acryl-based polymer, an imide-based polymer, a polyimide, an acryl-based polymer, and a siloxane-based polymer. The pixel defining layer 360 may contain a black dye to absorb light and/or not to transmit light.

A pixel opening 365 is formed in the pixel defining layer 360, and the pixel opening 365 of the pixel defining layer 360 may at least partially expose the pixel electrode 191. A light emitting element layer 370 may be disposed in the pixel opening 365 of the pixel defining layer 360.

The light emitting element layer 370 may include a material layer that emits light of one or more of basic/primary colors such as red, green, and blue. The light emitting element layer 370 may have a structure in which material layers emitting light of different colors are stacked.

A common electrode 270 may be disposed on the light emitting element layer 370 and the pixel defining layer 360. The common electrode 270 may be commonly provided to all pixels PX, and may receive a common voltage ELVSS through a common voltage transmitting part 27 disposed in the non-display area PA.

The common electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), or calcium (Ca), or a transparent conductive oxide (TCO) such as an indium tin oxide (ITO) or an indium zinc oxide (IZO).

The pixel electrode 191, the light emitting element layer 370, and the common electrode 270 form a light emitting diode (LED). The pixel electrode 191 may be an anode, which is a hole injection electrode, and the common electrode 270 may be a cathode, which is an electron injection electrode. The pixel electrode 191 may be a cathode, and the common electrode 270 may be an anode, according to a driving method of the OLED display.

Holes and electrons are injected into the light emitting element layer 370 from the pixel electrode 191 and the common electrode 270, respectively, and light is emitted when excitons in which the injected holes and electrons are combined enter a ground state from an excited state.

The oxide transistor To, which is a switching transistor, may include an oxide semiconductor, and the polycrystalline transistor Tp, which is a driving transistor, may include a polycrystalline semiconductor. For high-speed driving, motion of a motion picture may be more smoothly displayed by increasing an existing frequency of about 60 Hz to about 120 Hz, but this increases power consumption. To compensate for the increased power consumption, it is possible to decrease a frequency when driving a still image. For example, when a still image is driven, it may be driven at about 1 Hz. When the frequency is lowered, a leakage current may occur. In an embodiment, the leakage current may be minimized by making the oxide transistor To include an oxide semiconductor. In addition, since the polycrystalline transistor Tp, which is a driving transistor, includes a polycrystalline semiconductor, high electron mobility may be achieved. Since the switching transistor and the driving transistor contain different semiconductor materials, they may be more stably driven, and may have high reliability.

An encapsulation layer 390 is disposed on the common electrode 270. The encapsulation layer 390 may cover not only an upper surface of the display part 1000 but also a lateral surface of the display part 1000 to seal the display part 1000. The encapsulation layer 390 may be disposed on an entire surface of the display area DA, and it may extend from the display area DA such that an end of the encapsulation layer 390 may be disposed in the non-display area PA.

Since the organic light emitting element may be vulnerable to moisture and oxygen, the encapsulation layer 390 seals the display part 1000 to block moisture and oxygen from being introduced from the outside. The encapsulation layer 390 may include a plurality of layers, and may be a composite layer including both an inorganic layer and an organic layer. For example, the encapsulation layer 390 may have a triple-layer structure in which a first inorganic layer 390a, an organic layer 390b, and a second inorganic layer 390c are sequentially formed.

The touch part 2000 is disposed on the encapsulation layer 390.

Regarding the touch part 2000, a first insulating layer 410 is disposed on the encapsulation layer 390. The first insulating layer 410 may be formed of an inorganic layer containing a metal oxide, a metal acid nitride, a silicon oxide, a silicon nitride, or a silicon oxynitride, or of an organic layer. The first insulating layer 410 may cover the encapsulation layer 390 to protect the encapsulation layer 390 and prevent moisture permeation. The first insulating layer 410 may reduce parasitic capacitance between the common electrode 270 and the touch electrode.

A first touch cell connecting part 452 is disposed on the first insulating layer 410, and a second insulating layer 420 is disposed on the first touch cell connecting part 452. The second insulating layer 420 may be formed of an inorganic layer containing a metal oxide, a metal acid nitride, a silicon oxide, a silicon nitride, or a silicon oxynitride, or of an organic layer.

A first touch cell 451 is disposed on the second insulating layer 420. Although not shown, a second touch cell and a second touch cell connecting part may be disposed on the second insulating layer 420. One of the first touch cell 451 and the second touch cell may be a sensing input electrode, and the other may be a sensing output electrode. The first touch cell 451 and the second touch cell may be electrically separated/isolated from each other, and may be dispersed so as to not overlap each other and/or may be disposed in a mesh form. The first touch cells 451 may be connected to each other by first touch cell connecting parts 452, and the second touch cells may be connected to each other by second touch cell connecting parts.

A touch cell passivation layer 430 may be disposed on the first touch cell 451 and the second touch cell (not shown). The touch cell passivation layer 430 may protect the first touch cell 451 and the second touch cell (not shown) by covering the first touch cell 451 and the second touch cell (not shown) so that they are not exposed to the outside. The touch cell passivation layer 430 may include an inorganic material such as a silicon nitride ($SiN_x$) or a silicon oxide ($SiO_2$), or an organic material such as a polyacrylate resin and a polyimide resin.

The anti-reflection part 3000 is disposed on the touch part 2000.

The anti-reflection part 3000 includes a light blocking layer 520 and color filters 530A, 530B, and 530C.

The light blocking layer 520 may overlap the pixel defining layer 360 of the display part 1000, and may have a narrower width than that of the pixel defining layer 360. The light blocking layer 520 may be entirely disposed on the non-display area PA.

The light blocking layer 520 has a plurality of openings 521 overlapping the pixel opening 365 of the pixel defining layer 360, and each of the openings 521 overlaps the pixel opening 365. A width of each of the openings 521 of the light blocking layer 520 may be wider than that of the corresponding pixel opening 365.

The color filters 530A, 530B, and 530C are disposed on the light blocking layer 520. Most of each of the color filters 530A, 530B, and 530C may be disposed in the corresponding opening 521 of the light blocking layer 520. A planarization layer 540 may be disposed on the plurality of color filters 530A, 530B, and 530C.

The anti-reflection part 3000 substantially prevents external light from being reflected by a wire or the like of the display device 10 and viewed by a user of the display device 10. The light blocking layer 520 of the anti-reflection part 3000 may overlap the non-display area PA and an edge of a light emitting region of the display area DA, and thus may absorb incident external light to reduce light incident on the light emitting region.

The color filters 530A, 530B, and 530C of the anti-reflection part 3000 reduces an amount of external light incident to the pixel defining layer 360 and then reflected to be viewed by the user of the display device 10. Since the color filters 530A, 530B, and 530C do not completely block light, it is possible to prevent the reflected light from being visible/conspicuous without significantly reducing efficiency of light emitted by the light emitting element layer 370.

Generally, in order to prevent the reflected light of external light from being viewed, a polarization layer may be used, but this decreases the efficiency of light emitted by the light emitting element layer. According to embodiments, it is possible to effectively prevent the reflected light from being viewed without significantly sacrificing the efficiency of light emitted by the light-emitting element layer 370.

Figure 2:
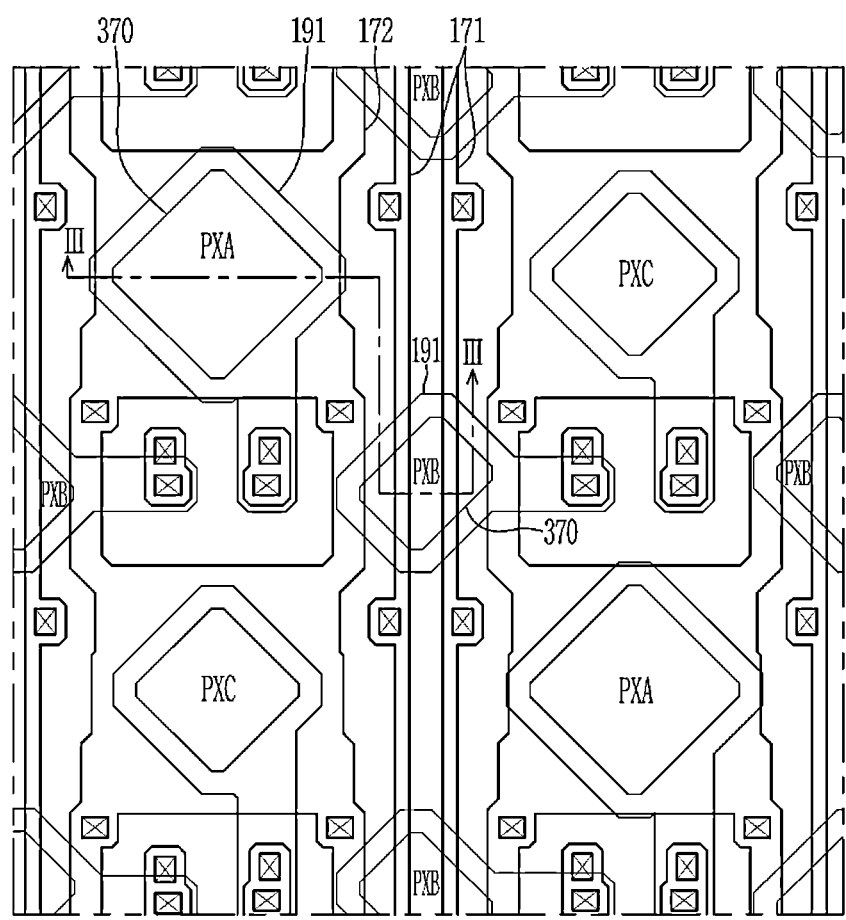
FIG. 2 illustrates a layout view (or plan view) of a portion of a display device according to an embodiment.
Figure 3:
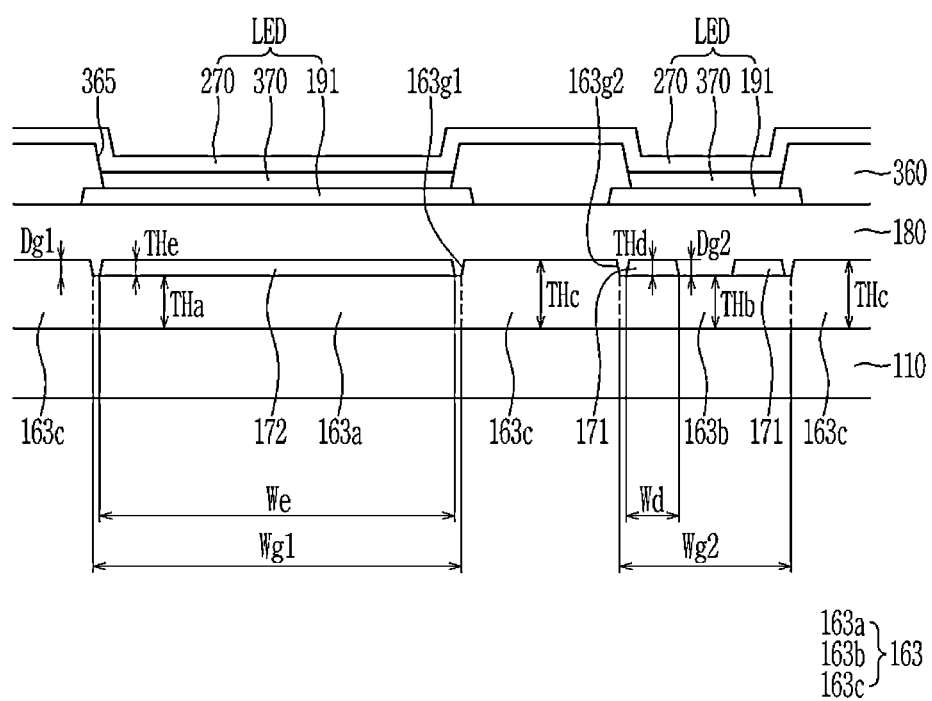
FIG. 3 illustrates a cross-sectional view of a display device taken along line III-III of FIG. 2.

FIG. 2 illustrates a layout view of a portion of a display device according to an embodiment, and FIG. 3 illustrates a cross-sectional view of a display device taken along line III-III of FIG. 2. FIG. 2 and FIG. 3 illustrate some layers of the display device according to the embodiment of FIG. 1. FIG. 3 illustrates that the third interlayer insulating layer 163 is disposed on the substrate 110, but the buffer layer 111, the first gate insulating layer 141, the second gate insulating layer 142, the first interlayer insulating layer 161, the third gate insulating layer 143, and the second interlayer insulating layer 162 that are disposed between the substrate 110 and the third interlayer insulating layer 163 may exist.

Referring to FIG. 2 and FIG. 3, the display device includes a plurality of first pixels PXA, a plurality of second pixels PXB, and a plurality of third pixels PXC that display different colors.

In one row of the display device, the first pixels PXA and the third pixels PXC may be spaced apart from each other by a predetermined interval, and in an adjacent row, the second pixels PXB may be spaced apart from each other by a predetermined interval. The rows in which the first pixels PXA and the third pixels PXC are alternately disposed and the row in which the second pixels PXB are repeatedly disposed may be alternately arranged. This pixel disposing structure is referred to as a PENTILE™ matrix, and according to the PENTILE™ matrix, by sharing adjacent pixels to display colors, high resolution may be realized with a small number of pixels.

For example, the first pixel PXA may be a blue pixel for displaying blue, the second pixel PXB may be a green pixel for displaying green, and the third pixel PXC may be a red pixel for displaying red.

The pixel electrode 191, the light emitting element layer 370, and the common electrode 270 are stacked in each pixel, and they may form a light emitting diode (LED). In the display device, most of external light incident from the outside may be blocked by the anti-reflection part 3000. Such external light is reflected by the pixel electrode 191 and the like, and when the pixel electrode 191 is sufficiently flat, reflectance of the external light is lowered.

The display device may include the third interlayer insulating layer 163, the data line 171, the driving voltage line 172, and the passivation layer 180 that are disposed between the substrate 110 and the pixel electrode 191. The data line 171 and the driving voltage line 172 may be disposed between the third interlayer insulating layer 163 and the passivation layer 180. The passivation layer 180 may be disposed above the data line 171 and the driving voltage line 172, and the pixel electrode 191 may be disposed above the passivation layer 180. The pixel electrode 191 may overlap at least a portion of the data line 171 and/or the driving voltage line 172. For example, in a first pixel PXA or third pixel PXC, the pixel electrode 191 may overlap a corresponding driving voltage line 172, and in a second pixel PXB, the pixel electrode 191 may overlap a corresponding data line 171. The pixel electrode 191 may overlap a wide portion or a narrow portion of the driving voltage line 172 in the first pixel PXA and/or the third pixel PXC. For example, about half an area of the pixel electrode 191 may overlap the driving voltage line 172. Under the pixel electrode 191, a step may occur due to the data line 171 and the driving voltage line 172 overlapping the pixel electrode 191. By reducing such a step, when an upper surface of the passivation layer 180 is sufficiently substantially flat, the pixel electrode 191 may be sufficiently flat. substantially flat The third interlayer insulating layer 163 may include a first groove 163g1 and a second groove 163g2. The third interlayer insulating layer 163 may include a first portion 163a in which the first groove 163g1 is formed, a second portion 163b in which the second groove 163g2 is formed, and a third portion 163c which occupies the remaining region. A thickness THa of the first portion 163a of the third interlayer insulating layer 163 may be less than a thickness THc of the third portion 163c. A thickness THb of the second portion 163b of the third interlayer insulating layer 163 may be less than the thickness THc of the third portion 163c. The thickness THa of the first portion 163a of the third interlayer insulating layer 163 may be substantially the same as the thickness THb of the second portion 163b of the third interlayer insulating layer 163.

The driving voltage line 172 may be disposed on the third interlayer insulating layer 163. The driving voltage line 172 may be disposed within the first groove 163g1 of the third interlayer insulating layer 163. Accordingly, the driving voltage line 172 may overlap the first portion 163a of the third interlayer insulating layer 163. A depth Dg1 of the first groove 163g1 of the third interlayer insulating layer 163 may correspond to a thickness THe of the driving voltage line 172. For example, the depth Dg1 of the first groove 163g1 of the third interlayer insulating layer 163 may be substantially the same as the thickness THe of the driving voltage line 172. A sum of the thickness THe of the driving voltage line 172 and the thickness THa of the first portion 163a of the third interlayer insulating layer 163 may be substantially the same as the thickness THc of the third portion 163c of the third interlayer insulating layer 163. Accordingly, an upper surface of the third portion 163c of the third interlayer insulating layer 163 and an upper surface of the driving voltage line 172 may be matched. That is, the upper surface of the third portion 163c of the third interlayer insulating layer 163 and the upper surface of the driving voltage line 172 may be substantially coplanar. Accordingly, the upper surface of the passivation layer 180 disposed on the third interlayer insulating layer 163 and the driving voltage line 172 may be substantially flat. A width Wg1 of the first groove 163g1 of the third interlayer insulating layer 163 may be greater than a width We of the driving voltage line 172. The width Wg1 of the first groove 163g1 of the third interlayer insulating layer 163 may be substantially the same as the width We of the driving voltage line 172.

The data line 171 may be disposed on the third interlayer insulating layer 163. The data line 171 may be disposed within the second groove 163g2 of the third interlayer insulating layer 163. Accordingly, the data line 171 may overlap the second portion 163b of the third interlayer insulating layer 163. A depth Dg2 of the second groove 163g2 of the third interlayer insulating layer 163 may correspond to a thickness THd of the data line 171. For example, the depth Dg2 of the second groove 163g2 of the third interlayer insulating layer 163 may be substantially the same as the thickness THd of the data line 171. A sum of the thickness THd of the data line 171 and the thickness THb of the second portion 163b of the third interlayer insulating layer 163 may be substantially the same as the thickness THc of the third portion 163c of the third interlayer insulating layer 163. Accordingly, an upper surface of the third portion 163c of the third interlayer insulating layer 163 and an upper surface of the data line 171 may be matched. That is, the upper surface of the third portion 163c of the third interlayer insulating layer 163 and the upper surface of the data line 171 may be substantially coplanar. Accordingly, the upper surface of the passivation layer 180 disposed on the third interlayer insulating layer 163 and the data line 171 may be substantially flat. A width Wg2 of the second groove 163g2 of the third interlayer insulating layer 163 may be greater than a width Wd of the data line 171. The width Wg2 of the second groove 163g2 of the third interlayer insulating layer 163 may be substantially the same as the width Wd of the data line 171. Two data lines 171 may be disposed within the second groove 163g2 of the third interlayer insulating layer 163. In this case, the width Wg2 of the second groove 163g2 of the third interlayer insulating layer 163 may be at least twice or more of the width Wd of the data line 171.

Because the driving voltage line 172 is disposed within the first groove 163g1 of the third interlayer insulating layer 163, and because the data line 171 is disposed within the second groove 163g2 of the third interlayer insulating layer 163, the upper surface of the passivation layer 180 may be substantially flat. In other words, it is possible to prevent a step from occurring due to the driving voltage line 172 and the data line 171. The pixel electrode 191 is disposed on the passivation layer 180, and an upper surface of the pixel electrode 191 may be substantially flat. When light incident from the outside is reflected on a pixel electrode 191 that is not sufficiently flat, color bleeding may occur. In the display device, the pixel electrode 191 has a flat upper surface, thereby reducing the reflectance of external light and preventing such color bleeding.

If the passivation layer 180 disposed under the pixel electrode 191 is too thick, a step caused by signal lines (such as the data line 171 and the driving voltage line 172) disposed under the passivation layer 180 may not affect the pixel electrode 191, but an internal gas generated in a baking process for forming the passivation layer 180 and the insulating layers disposed thereunder may not be discharged to the outside, and thus, the light emitting element layer may deteriorate or the electrode layer of the organic element may be discolored, such that the light emitting characteristics of the light emitting element layer may deteriorate.

If the passivation layer 180 is formed thin in order to discharge an internal gas that may occur in a process of forming an insulating layer containing an organic material, a step may undesirably occur on the surface of the pixel electrode 191.

In embodiments, by forming the grooves 163g1 and 163g2 in the third interlayer insulating layer 163 and by disposing the driving voltage line 172 and the data line 171 within the grooves 163g1 and 163g2, it is possible to prevent the undesirable occurrence of a step. Although the passivation layer 180 is substantially thin, the upper surface of the passivation layer 180 may be flat. For example, in a structure in which the grooves 163g1 and 163g2 are not formed in the third interlayer insulating layer 163, in order to form the passivation layer 180 flat, the thickness of the passivation layer 180 may be about 3.1 μm. In embodiments, the thickness of the passivation layer 180 may be reduced to about 2.4 μm. Advantageously, an internal gas that may occur in the process of forming the insulating layer containing an organic material may be effectively discharged.

The third interlayer insulating layer 163 may include the first groove 163g1, and may not include the second groove 163g2. The third interlayer insulating layer 163 may include the second groove 163g2, and may not include the first groove 163g1.

Figure 4:
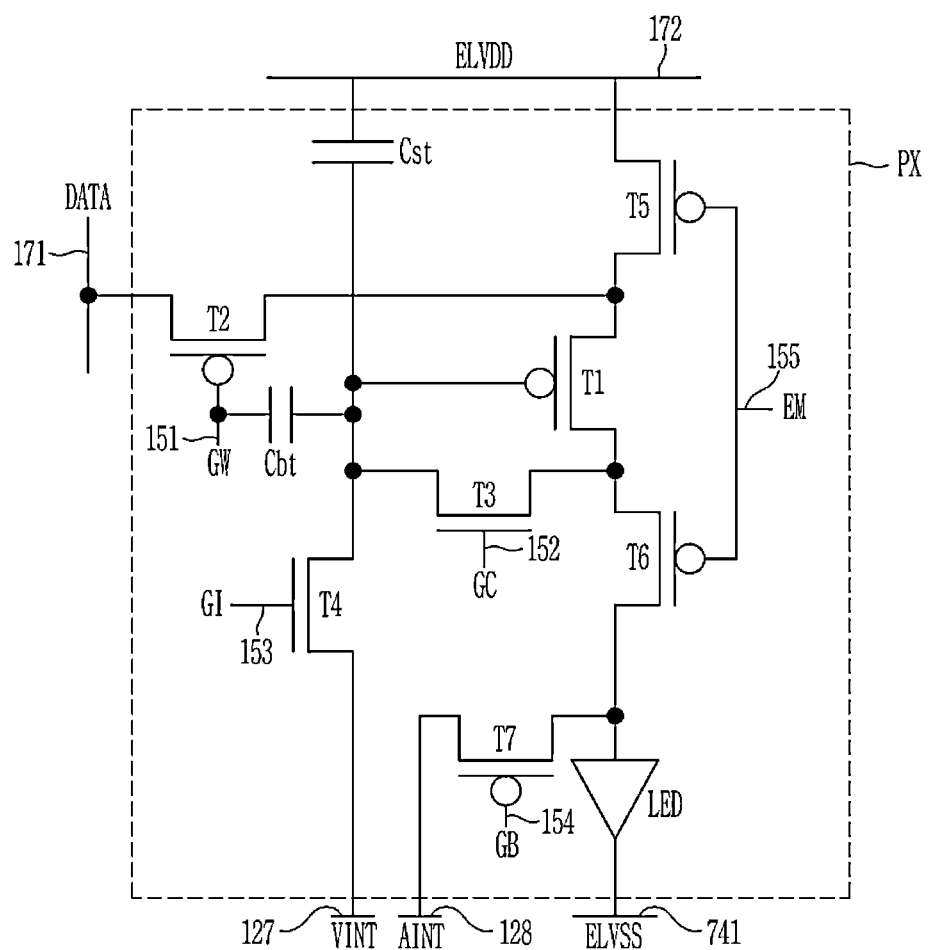
FIG. 4 illustrates a circuit diagram of a display device according to an embodiment.
Figure 5:
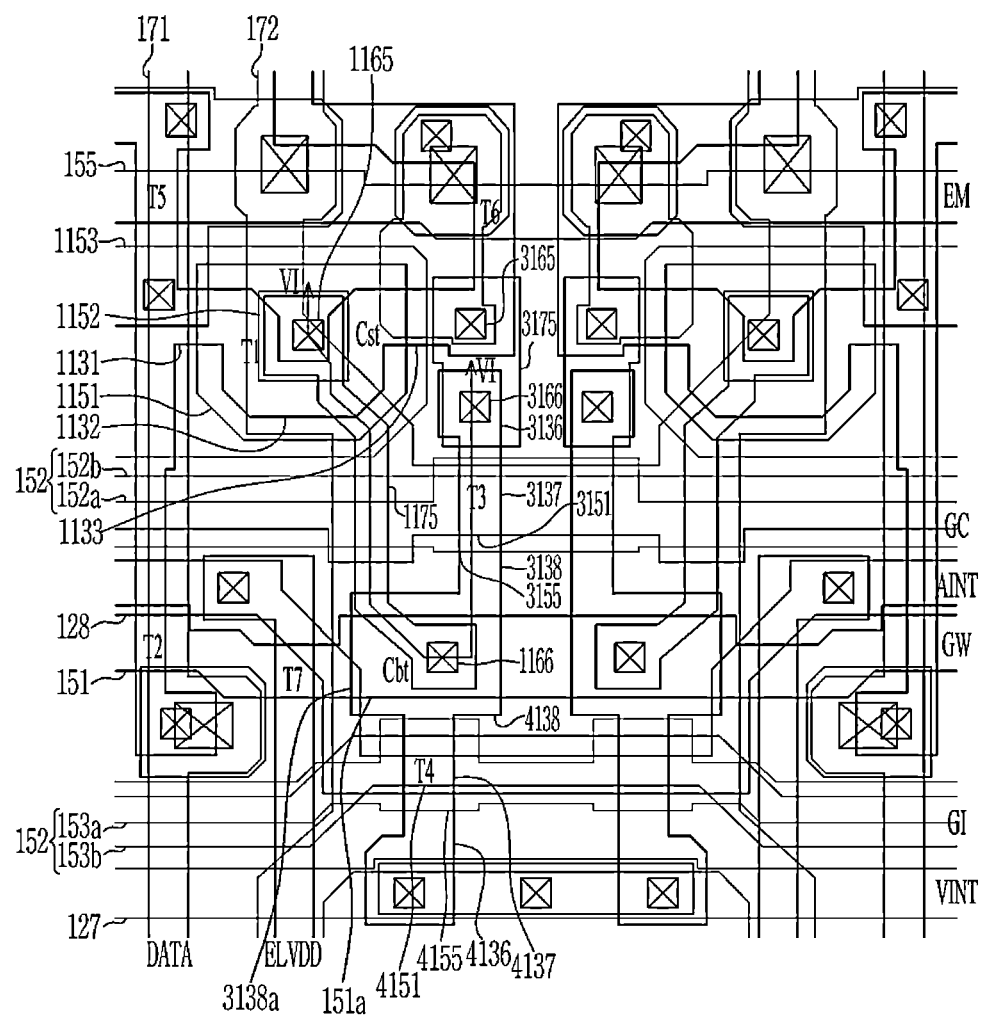
FIG. 5 illustrates a (top) plan view of a display device according to an embodiment.
Figure 6:
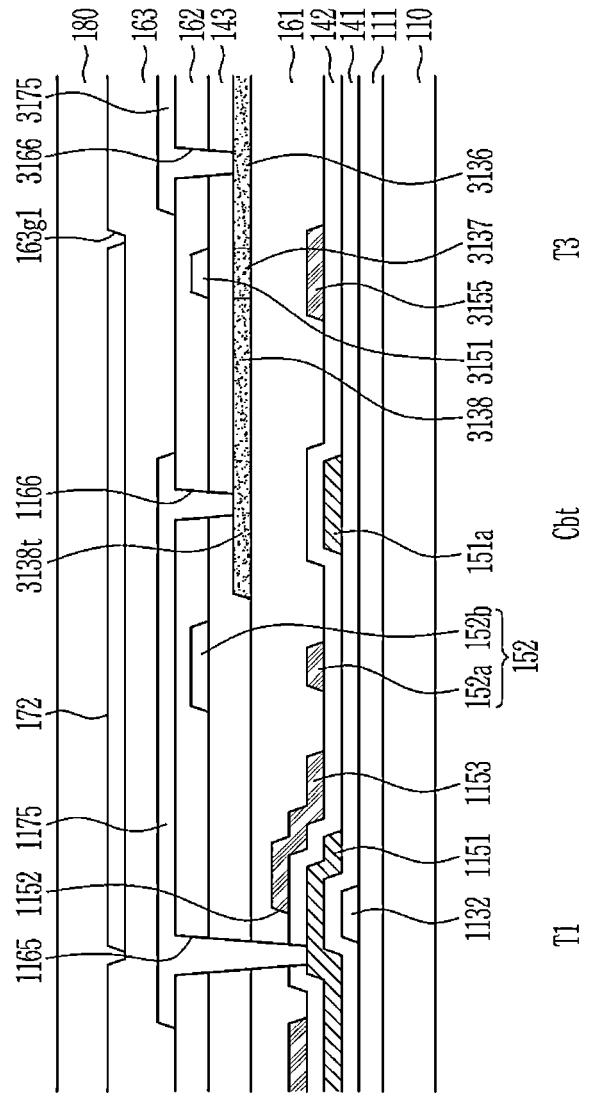
FIG. 6 illustrates a cross-sectional view of a display device taken along line VI-VI of FIG. 5.

FIG. 4 illustrates a circuit diagram of a display device according to an embodiment, FIG. 5 illustrates a plan view of a display device according to an embodiment, and FIG. 6 illustrates a cross-sectional view of a display device taken along line VI-VI of FIG. 5. FIG. 7 to FIG. 13 sequentially illustrate plan views of structures formed in a manufacturing method of a display device according to one or more embodiments.

As shown in FIG. 4, one pixel PX of the display device includes transistors T1, T2, T3, T4, T5, T6, and T7, a storage capacitor Cst, a boost capacitor Cbt, and a light emitting diode LED, connected to a plurality of wires 127, 128, 151, 152, 153, 154, 155, 171, 172, and 741.

The plurality of wires 127, 128, 151, 152, 153, 154, 155, 171, 172, and 741 are connected to one pixel PX. The plurality of wires includes a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a gate driver (not shown) to transmit a first scan signal GW to the second transistor T2. The second scan line 152 may be applied with a voltage of an opposite polarity to a voltage applied to the first scan line 151 at the same timing as that of a signal of the first scan line 151. For example, when a negative voltage is applied to the first scan line 151, a positive voltage may be applied to the second scan line 152. The second scan line 152 transmits a second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may include the previous first scan line 151. The light emission control line 155 transmits a light emission control signal EM to the fifth transistor T5 and the sixth transistor T6.

The data line 171 is a wire that transmits a data voltage DATA generated by a data driver (not shown), and luminance emitted by the light emitting diode LED is changed according to the data voltage DATA applied to the pixel PX.

The driving voltage line 172 applies a driving voltage ELVDD. The first initialization voltage line 127 transmits a first initialization voltage VINT, and the second initialization voltage line 128 transmits a second initialization voltage AINT. The common voltage line 741 applies a common voltage ELVSS to a cathode electrode of the light emitting diode LED. In the present embodiment, each of voltages applied to the driving voltage line 172, the first and second initialization voltage lines 127 and 128, and the common voltage line 741 may be a constant voltage.

The plurality of transistors may include a driving transistor T1, a second transistor T2, a third transistor T3, a fourth transistor T4, a fifth transistor T5, a sixth transistor T6, and a seventh transistor T7. The plurality of transistors may include an oxide transistor including an oxide semiconductor and a polycrystalline transistor including a polycrystalline semiconductor. For example, the third transistor T3 and the fourth transistor T4 may be made as oxide transistors, and the driving transistor T1, the second transistor T2, the fifth transistor T5, the sixth transistor T6, and the seventh transistor T7 may be made as polycrystalline transistors. The transistors T1 to T7 may all be made as polycrystalline transistors.

One pixel may include seven transistors T1 to T7, one storage capacitor Cst, and on one boost capacitor Cbt. The number of transistors, the number of capacitors, and their connection relationship may be configured according to embodiments.

Figure 7:
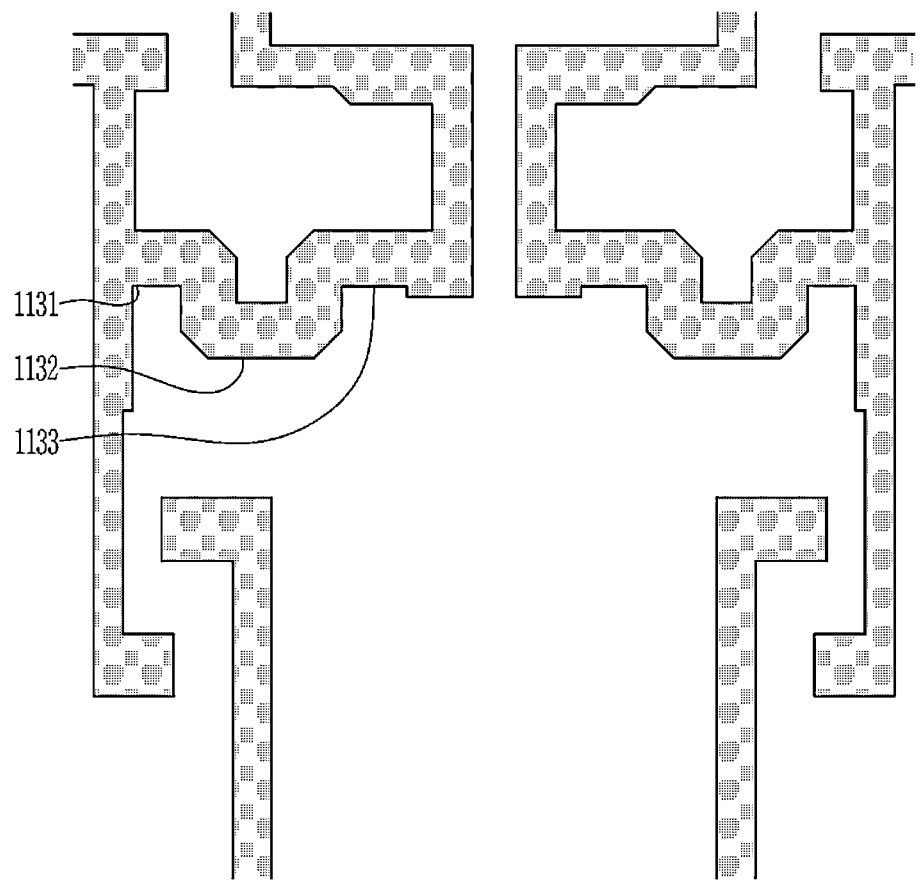
FIG. 7, FIG. 8, FIG. 9, FIG. 10, FIG. 11, FIG. 12, and FIG. 13 sequentially illustrate plan views of structures formed in a manufacturing method of a display device according to one or more embodiments.

With reference to FIG. 6, the buffer layer 111 may be disposed on the substrate 110, and a polycrystalline semiconductor layer including a channel 1132, a first region 1131, and a second region 1133 of the driving transistor T1 may be disposed on the buffer layer 111. FIG. 7 illustrates the polycrystalline semiconductor layer. The polycrystalline semiconductor layer may further include a channel, a first region, and a second region of each of the second transistor T2, the fifth transistor T5, the sixth transistor T6, and the seventh transistor T7, as well as the driving transistor T1.

The channel 1132 of the driving transistor T1 may have a curved shape in a plan view. The channel 1132 of the driving transistor T1 may be bent in a different shape, or may be formed in a rod shape. The first region 1131 and the second region 1133 of the driving transistor T1 may be disposed on opposite sides of the channel 1132 of the driving transistor T1. Portions of the first region 1131 of the driving transistor T1 may extend up and down in a plan view, and a portion extending in the down direction may be connected to the second region of the second transistor T2, and a portion extending in the up direction may be connected to the second region of the fifth transistor T5. The second region 1133 of the driving transistor T1 may extend upward in a plan view to be connected to the first region of the sixth transistor T6.

A first gate insulating layer 141 may be disposed on the polycrystalline semiconductor layer including the channel 1132, the first region 1131, and the second region 1133 of the driving transistor T1.

Figure 8:
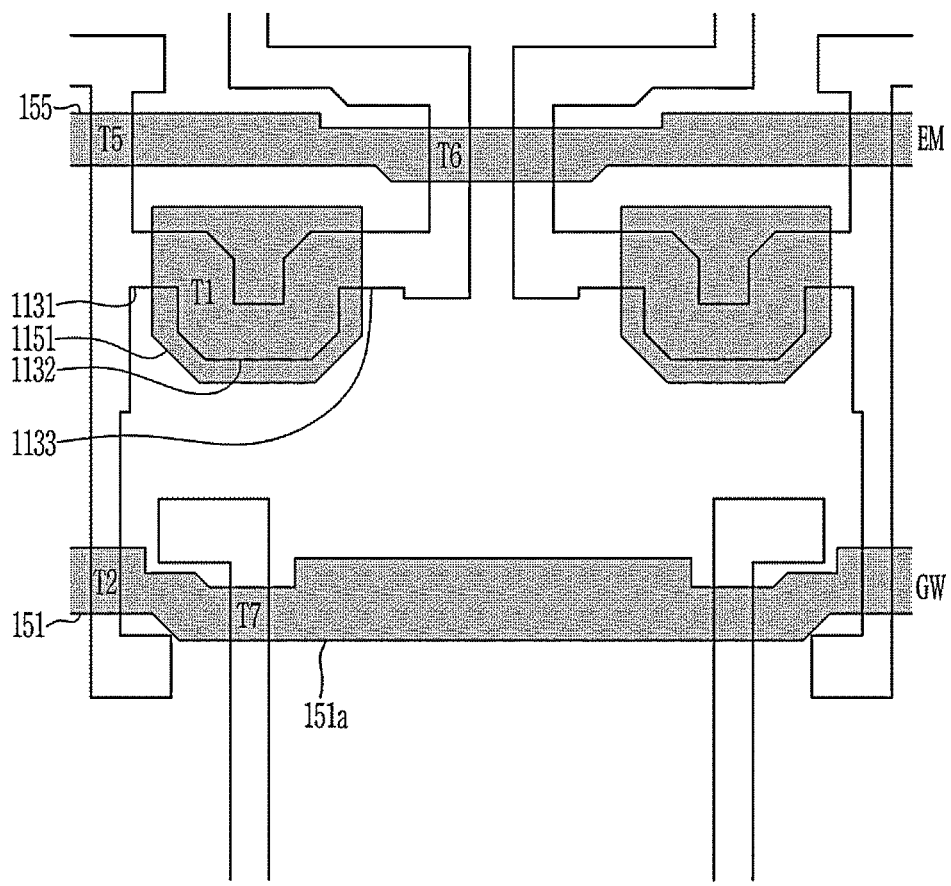

A first gate conductor including a gate electrode 1151 of the driving transistor T1 may be disposed on the first gate insulating layer 141. FIG. 8 illustrates the polycrystalline semiconductor layer and the first gate conductor. The first gate conductor may further include a gate electrode of each of the second transistor T2, the fifth transistor T5, the sixth transistor T6, and the seventh transistor T7, as well as the driving transistor T1.

The gate electrode 1151 of the driving transistor T1 may overlap the channel 1132 of the driving transistor T1. The channel 1132 of the driving transistor T1 is covered by the gate electrode 1151 of the driving transistor T1.

The first gate conductor may further include the first scan line 151 and the light emission control line 155. The first scan line 151 and the light emission control line 155 may substantially extend in a horizontal direction. The first scan line 151 may be integrated with the gate electrode of the second transistor T2. A bypass control line connected to the seventh transistor T7 may be formed with the previous first scan line 151. The gate electrode of the fifth transistor T5 and the gate electrode of the sixth transistor T6 may be integrally formed with the light emission control line 155.

After the first gate conductor including the gate electrode 1151 of the driving transistor T1 is formed, a doping process may be performed. The polycrystalline semiconductor layer covered by the first gate conductor is not doped, and a portion of the polycrystalline semiconductor layer that is not covered by the first gate conductor is doped such that the portion may have the same characteristic as the conductor. A doping process may be performed with a p-type dopant, and thus, the driving transistor T1, the second transistor T2, the fifth transistor T5, the sixth transistor T6, and the seventh transistor T7 including the polycrystalline semiconductor layer may have p-type transistor characteristics.

A second gate insulating layer 142 may be disposed on the first gate conductor and the first gate insulating layer 141 including the gate electrode 1151 of the driving transistor T1.

Figure 9:
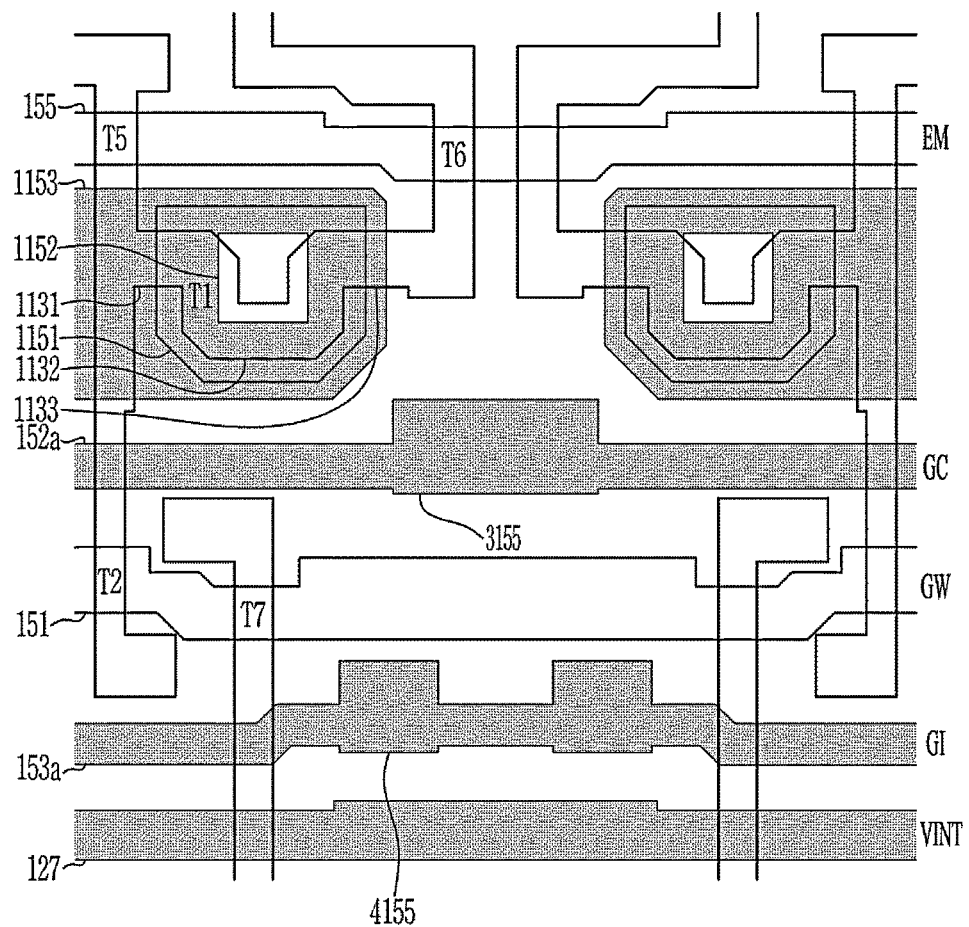

A second gate conductor including a first storage electrode 1153 of the storage capacitor Cst, a lower gate electrode 3155 of the third transistor T3, and a lower gate electrode 4155 of the fourth transistor T4 may be disposed on the second gate insulating layer 142. FIG. 9 illustrates the polycrystalline semiconductor, the first gate conductor, and the second gate conductor.

The first storage electrode 1153 overlaps the gate electrode 1151 of the driving transistor T1 to form the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The lower gate electrode 3155 of the third transistor T3 may overlap a channel 3137 and an upper gate electrode 3151 of the third transistor T3. The lower gate electrode 4155 of the fourth transistor T4 may overlap a channel 4137 and an upper gate electrode 4151 of the fourth transistor T4.

The second gate conductor may further include a lower second scan line 152a, a lower initialization control line 153a, and a first initialization voltage line 127. The lower second scan line 152a, the lower initialization control line 153a, and the first initialization voltage line 127 may substantially extend in a horizontal direction. The lower second scan line 152a may be integrally formed with the lower gate electrode 3155 of the third transistor T3. The lower initialization control line 153a may be integrally formed with the lower gate electrode 4155 of the fourth transistor T4.

A first interlayer insulating layer 161 may be disposed on the second gate conductor including the first storage electrode 1153 of the storage capacitor Cst, the lower gate electrode 3155 of the third transistor T3, and the lower gate electrode 4155 of the fourth transistor T4.

Figure 10:
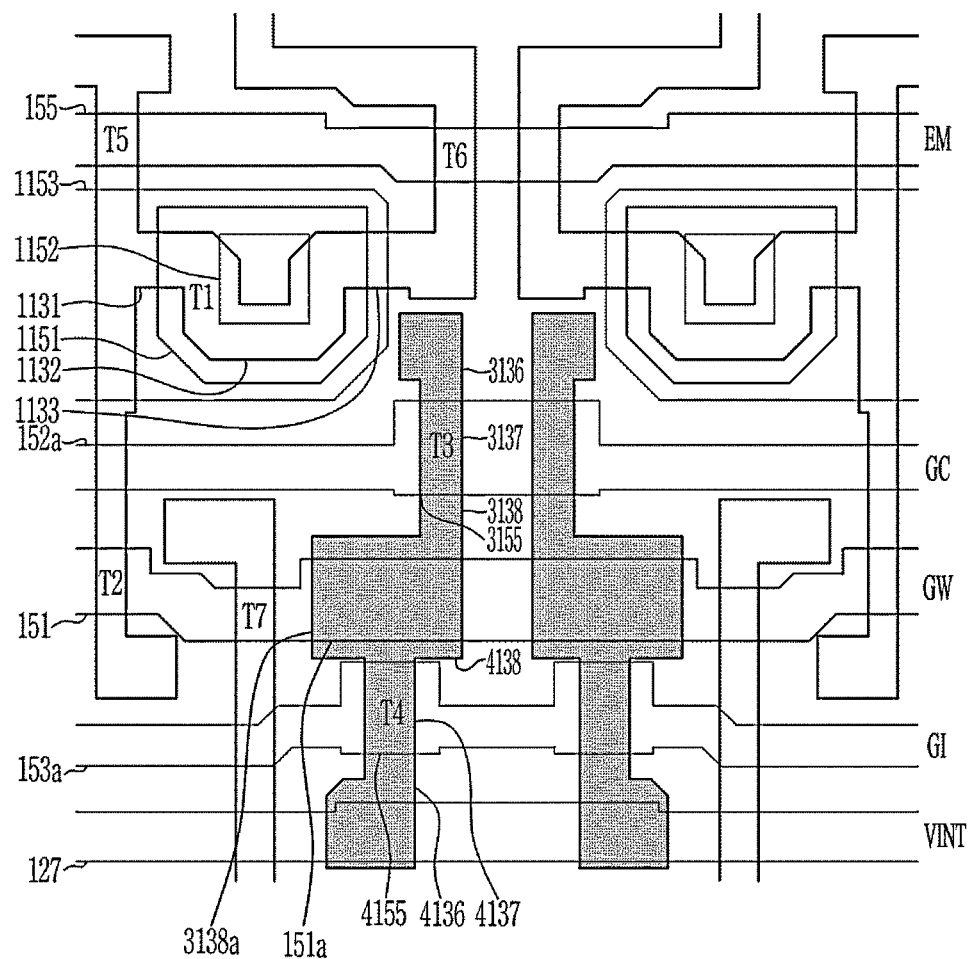

The oxide semiconductor layer including the channel 3137, the first region 3136, and the second region 3138 of the third transistor T3, and the channel 4137, the first region 4136, and the second region 4138 of the fourth transistor T4 may be disposed on the first interlayer insulating layer 161. FIG. 10 illustrates a polycrystalline semiconductor layer, a first gate conductor, a second gate conductor, and an oxide semiconductor layer.

A channel 3137, a first region 3136, and a second region 3138 of the third transistor T3, and a channel 4137, a first region 4136, and a second region 4138 of the fourth transistor T4 may be connected to each other to be integrally formed. The first region 3136 and the second region 3138 of the third transistor T3 may be disposed at respective sides of the channel 3137 of the third transistor T3. The first region 4136 and the second region 4138 of the fourth transistor T4 may be disposed at respective sides of the channel 4137 of the fourth transistor T4. The second region 3138 of the third transistor T3 may be connected the second region 4138 of the fourth transistor T4. The channel 3137 of the third transistor T3 may overlap the lower gate electrode 3155. The channel 4137 of the fourth transistor T4 may overlap the lower gate electrode 4155.

A third gate insulating layer 143 may be disposed on the oxide semiconductor layer including the channel 3137, the first region 3136, and the second region 3138 of the third transistor T3, and the channel 4137, the first region 4136, and the second region 4138 of the fourth transistor T4. The third gate insulating layer 143 may be disposed on an entire surface of the oxide semiconductor layer and the first interlayer insulating layer 161. Therefore, the third gate insulating layer 143 may cover upper and lateral surfaces of the channel 3137, the first region 3136, and the second region 3138 of the third transistor T3, and of the channel 4137, the first region 4136, and the second region 4138 of the fourth transistor T4. However, the present embodiment is not limited thereto, and the third gate insulating layer 143 may not be disposed on the entire surface of the oxide semiconductor layer and the first interlayer insulating layer 161. For example, the third gate insulating layer 143 may overlap the channel 3137 of the third transistor T3, and it may not overlap the first region 3136 and the second region 3138. In addition, the third gate insulating layer 143 may overlap the channel 4137 of the fourth transistor T4, and it may not overlap the first region 4136 and the second region 4138.

Figure 11:
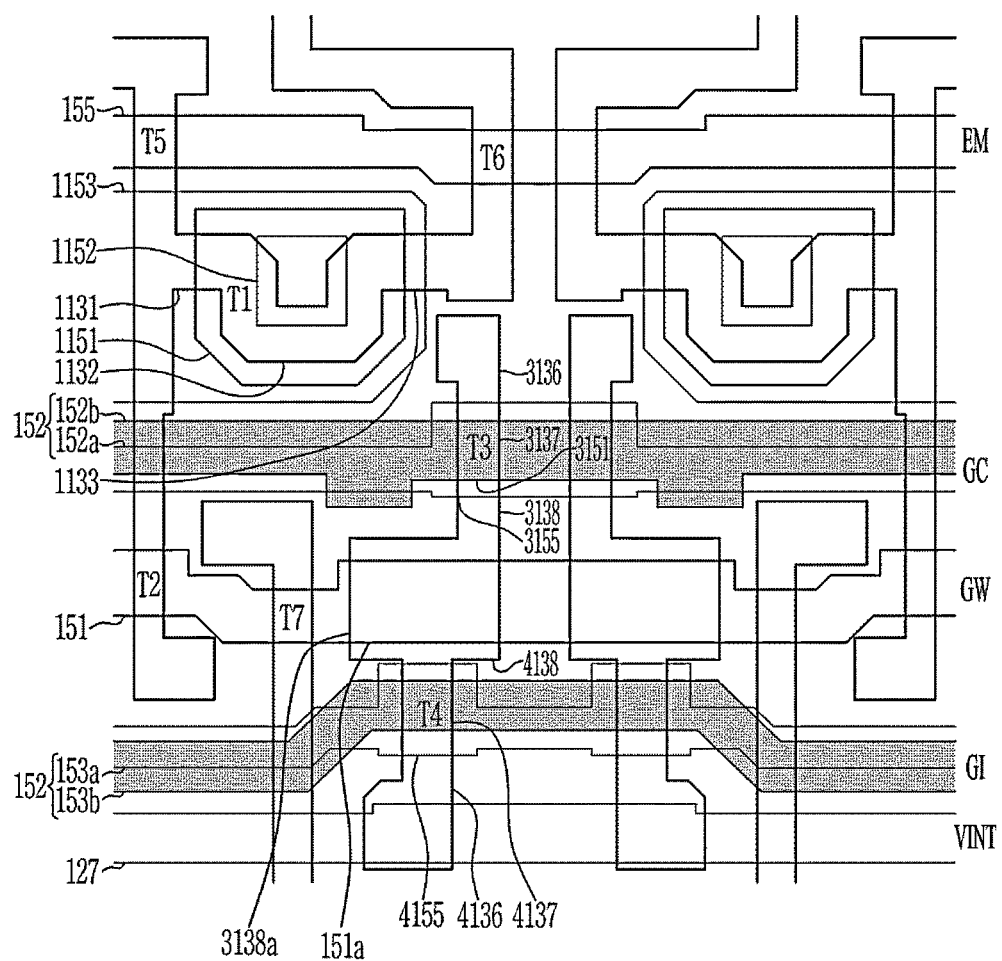

A third gate conductor including the upper gate electrode 3151 of the third transistor T3 and the upper gate electrode 4151 of the fourth transistor T4 may be disposed on the third gate insulating layer 143. FIG. 11 illustrates a polycrystalline semiconductor layer, a first gate conductor, a second gate conductor, an oxide semiconductor layer, and a third gate conductor.

The upper gate electrode 3151 of the third transistor T3 may overlap the channel 3137 of the third transistor T3. The upper gate electrode 3151 of the third transistor T3 may overlap the lower gate electrode 3155 of the third transistor T3.

The upper gate electrode 4151 of the fourth transistor T4 may overlap the channel 4137 of the fourth transistor T4. The upper gate electrode 4151 of the fourth transistor T4 may overlap the lower gate electrode 4155 of the fourth transistor T4.

The third gate conductor may further include an upper second scan line 152b and an upper initialization control line 153b.

The upper second scan line 152b and the upper initialization control line 153b may substantially extend in a horizontal direction. The upper second scan line 152b forms the second scan line 152 together with the lower second scan line 152a. The upper second scan line 152b may be integrally formed with the upper gate electrode 3151 of the third transistor T3. The upper initialization control line 153b forms the initialization control line 153 together with the lower initialization control line 153a. The upper initialization control line 153b may be integrally formed with the upper gate electrode 4151 of the fourth transistor T4.

After the third gate conductor including the upper gate electrode 3151 of the third transistor T3 and the upper gate electrode 4151 of the fourth transistor T4 are formed, a doping process may be performed. A portion of the oxide semiconductor layer that is covered by the third gate conductor is not doped, and a portion of the oxide semiconductor layer that is not covered by the third gate conductor is doped, so that it may have the same characteristics as the conductor. The channel 3137 of the third transistor T3 may be disposed under the upper gate electrode 3151 to overlap the upper gate electrode 3151. The first region 3136 and the second region 3138 of the third transistor T3 may not overlap the upper gate electrode 3151. The channel 4137 of the fourth transistor T4 may be disposed under the upper gate electrode 4151 to overlap the upper gate electrode 4151. The first region 4136 and the second region 4138 of the fourth transistor T4 may not overlap the upper gate electrode 4151. The upper boost electrode 3138t may not overlap the third gate conductor. The doping process of the oxide semiconductor layer may be performed with an n-type dopant, and the third transistor T3 and the fourth transistor T4 including the oxide semiconductor layer may have an n-type transistor characteristic.

A second interlayer insulating layer 162 may be disposed on the third gate conductor including the upper gate electrode 3151 of the third transistor T3 and the upper gate electrode 4151 of the fourth transistor T4. The second interlayer insulating layer 162 may have a single layered or multi-layered structure. The second interlayer insulating layer 162 may include an inorganic insulating material such as a silicon nitride (SiNx), a silicon oxide (SiOx), and a silicon oxynitride (SiOxNy). The second interlayer insulating layer 162 may include a first opening 1165, a second opening 1166, a third opening 3165, and a fourth opening 3166.

The first opening 1165 may overlap at least a portion of the gate electrode 1151 of the driving transistor T1. The first opening 1165 may be further formed in the third gate insulating layer 143, the first interlayer insulating layer 161, and the second gate insulating layer 142. The first opening 1165 may overlap the opening 1152 of the first storage electrode 1153. The first opening 1165 may be disposed inside the opening 1152 of the first storage electrode 1153. The second opening 1166 may overlap at least a portion of the boost capacitor Cbt. The second opening 1166 may be further formed in the third gate insulating layer 143.

The third opening 3165 may overlap at least a portion of the second region 1133 of the driving transistor T1. The third opening 3165 may be further formed in the third gate insulating layer 143, the first interlayer insulating layer 161, the second gate insulating layer 142, and the first gate insulating layer 141. The fourth opening 3166 may overlap at least a portion of the first region 3136 of the third transistor T3. The fourth opening 3166 may be further formed in the third gate insulating layer 143.

Figure 12:
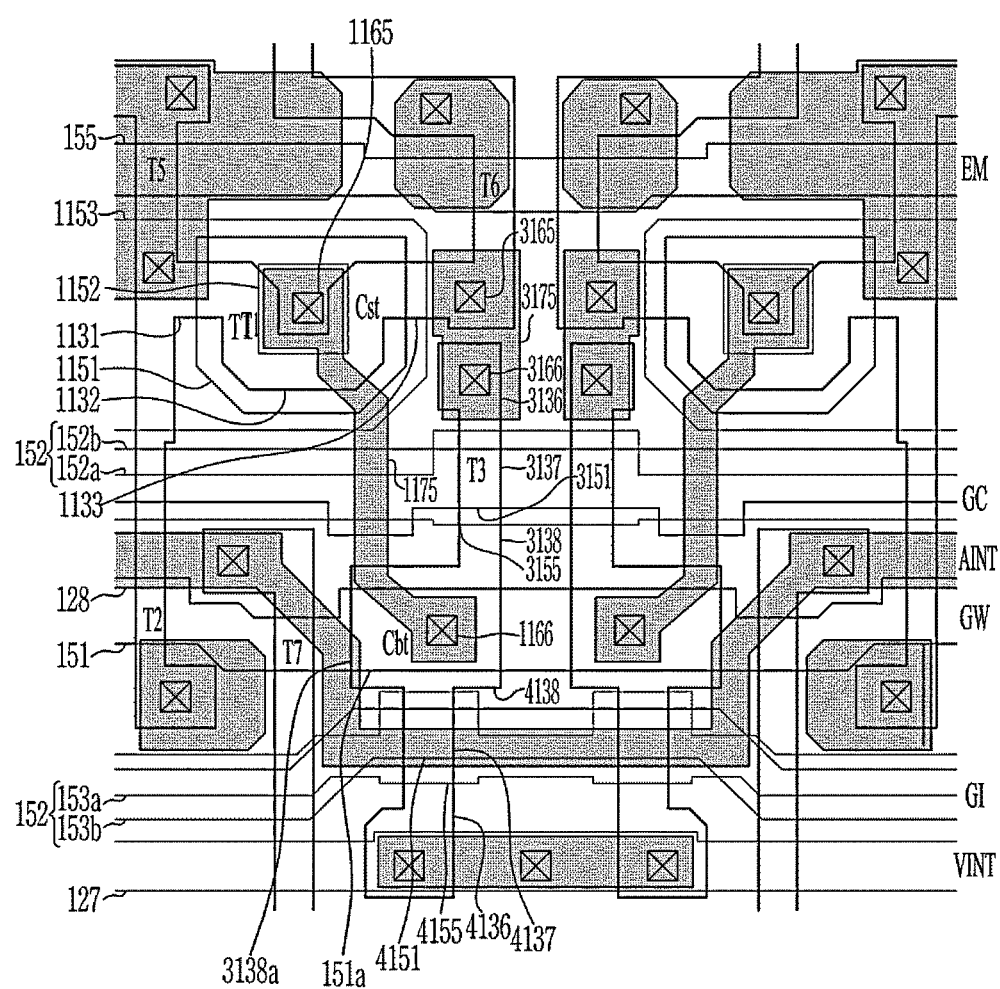

A first data conductor including a first connection electrode 1175 and a second connection electrode 3175 may be disposed on the second interlayer insulating layer 162. FIG. 12 illustrates a polycrystalline semiconductor layer, a first gate conductor, a second gate conductor, an oxide semiconductor layer, a third gate conductor, and a first data conductor.

The first connection electrode 1175 may overlap the gate electrode 1151 of the driving transistor T1. The first connection electrode 1175 may be connected to the gate electrode 1151 of the driving transistor T1 through the first opening 1165 and the opening 1152 of the first storage electrode 1153. The first connection electrode 1175 may overlap the boost capacitor Cbt. The first connection electrode 1175 may be connected to the upper boost electrode 3138t of the boost capacitor Cbt through the second opening 1166. Accordingly, the gate electrode 1151 of the driving transistor T1 and the upper boost electrode 3138t of the boost capacitor Cbt may be connected by the first connection electrode 1175. In this case, the gate electrode 1151 of the driving transistor T1 may be connected to the second region 3138 of the third transistor T3 and the second region 4138 of the fourth transistor T4 by the first connection electrode 1175.

The second connection electrode 3175 may overlap the second region 1133 of the driving transistor T1. The second connection electrode 3175 may be connected to the second region 1133 of the driving transistor T1 through the third opening 3165. The second connection electrode 3175 may overlap the first region 3136 of the third transistor T3. The second connection electrode 3175 may be connected to the first region 3136 of the third transistor T3 through the fourth opening 3166. Accordingly, the second region 1133 of the driving transistor T1 and the first region 3136 of the third transistor T3 may be connected by the second connection electrode 3175.

The first data conductor may further include the second initialization voltage line 128. The second initialization voltage line 128 may substantially extend in a horizontal direction.

A third interlayer insulating layer 163 may be disposed on the first data conductor including the first connection electrode 1175 and the second connection electrode 3175.

Figure 13:
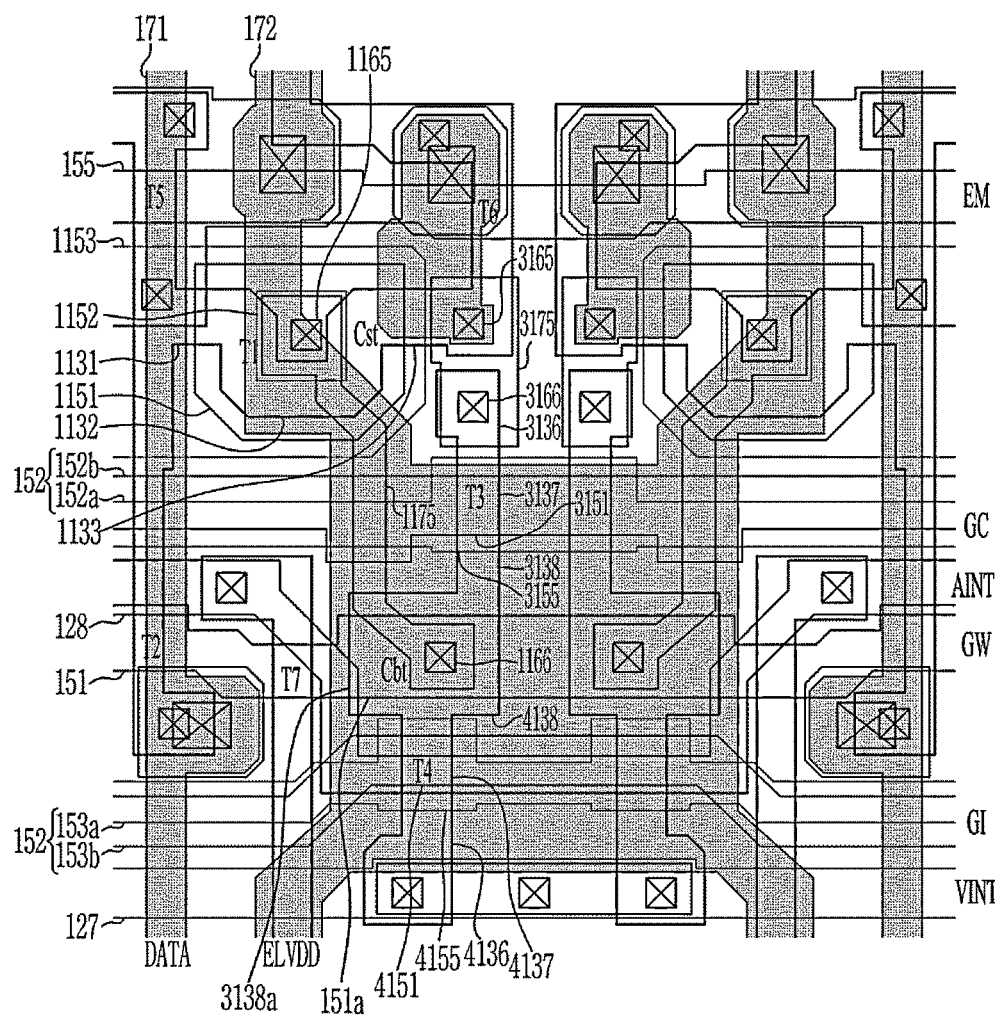

A second data conductor including the data line 171 and the driving voltage line 172 may be disposed on the third interlayer insulating layer 163. FIG. 13 illustrates a polycrystalline semiconductor layer, a first gate conductor, a second gate conductor, an oxide semiconductor layer, a third gate conductor, a first data conductor, and a second data conductor.

The data line 171 and the driving voltage line 172 may substantially extend in a vertical direction. The data line 171 may be connected to the second transistor T2. The driving voltage line 172 may be connected to the fifth transistor T5. In addition, the driving voltage line 172 may be connected to the first storage electrode 1153. As described above, the third interlayer insulating layer 163 may include a first groove 163g1 and a second groove 163g2. The driving voltage line 172 may be disposed within the first groove 163g1 of the third interlayer insulating layer 163, and the data line 171 may be disposed within the second groove 163g2 of the third interlayer insulating layer 163.

The passivation layer 180 may be disposed on the data line 171 and the driving voltage line 172. Although not illustrated in FIG. 5 and FIG. 6, a pixel electrode may be disposed on the passivation layer 180. A pixel defining layer may be disposed on the pixel electrode, a light emitting element layer may be disposed within a pixel opening of the pixel defining layer, and a common electrode may be disposed on the pixel defining layer and the light emitting element layer.

Figure 14:
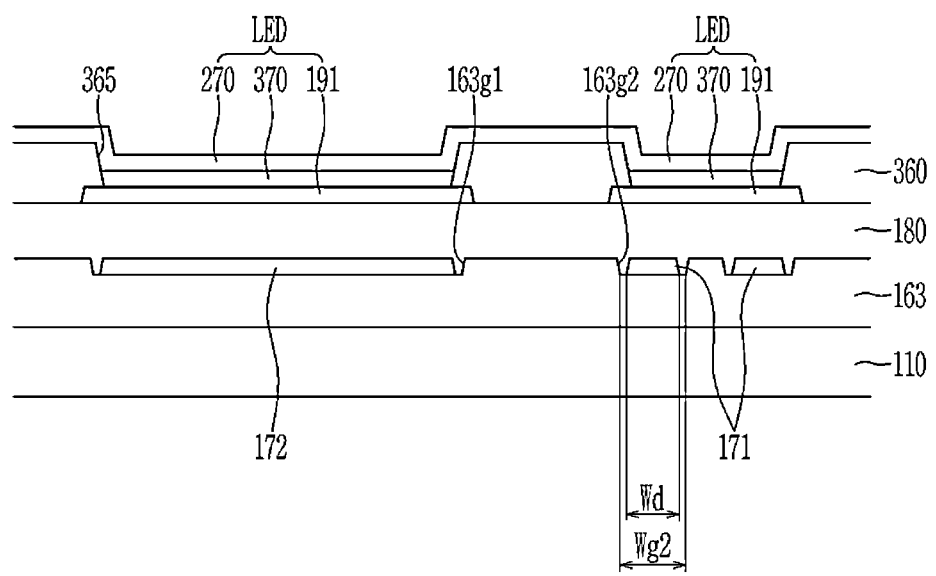
FIG. 14 illustrates a cross-sectional view of a display device according to an embodiment.

FIG. 14 illustrates a cross-sectional view of a display device according to an embodiment. Some elements and/or features associated with FIG. 14 may be analogous to or identical to some elements and/or features described with references to one or more of FIG. 1 to FIG. 13.

As shown in FIG. 14, the display device may include the substrate 110, the pixel electrode 191 disposed on the substrate 110, and the third interlayer insulating layer 163, the data lines 171, the driving voltage line 172, and the passivation layer 180 that are disposed between the substrate 110 and the pixel electrode 191. The data lines 171 and the driving voltage line 172 may be disposed on the third interlayer insulating layer 163, and the passivation layer 180 may be disposed on the data lines 171 and the driving voltage line 172.

The third interlayer insulating layer 163 may include the first groove 163g1 and the second grooves 163g2. The driving voltage line 172 may be disposed within the first groove 163g1 of the third interlayer insulating layer 163. The data lines 171 may be disposed within the second grooves 163g2 of the third interlayer insulating layer 163.

In an embodiment, two data lines 171 may be disposed within the same second groove 163g2 of the third interlayer insulating layer 163. In an embodiment, exactly one data line 171 may be disposed within one second groove 163g2 of the third interlayer insulating layer 163. The number of the data lines 171 disposed within each second groove 163g2 of the third interlayer insulating layer 163 may be configured according to embodiments. The width Wg2 of the second groove 163g2 of the third interlayer insulating layer 163 may be greater than the width Wd of the data line 171. The width Wg2 of the second groove 163g2 of the third interlayer insulating layer 163 may be substantially the same as the width Wd of the data line 171.

Figure 15:
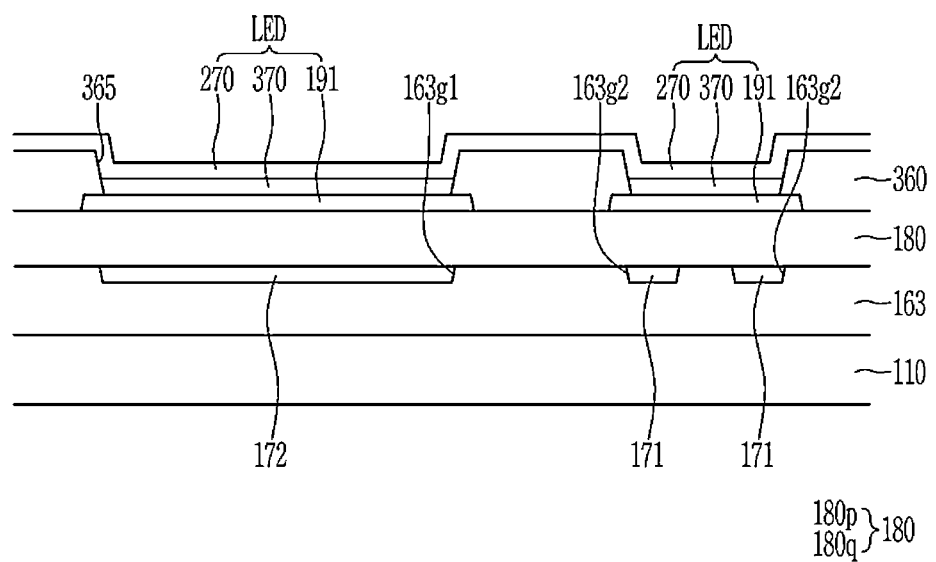
FIG. 15 illustrates a cross-sectional view of a display device according to an embodiment.

FIG. 15 illustrates a cross-sectional view of a display device according to an embodiment. Some elements and/or features associated with FIG. 15 may be analogous to or identical to some elements and/or features described with references to one or more of FIG. 1 to FIG. 14.

As shown in FIG. 15, the display device may include the substrate 110, the pixel electrode 191 disposed on the substrate 110, and the third interlayer insulating layer 163, the data lines 171, the driving voltage line 172, and the passivation layer 180 that are disposed between the substrate 110 and the pixel electrode 191. The data lines 171 and the driving voltage line 172 may be disposed on the third interlayer insulating layer 163, and the passivation layer 180 may be disposed on the data lines 171 and the driving voltage line 172.

The third interlayer insulating layer 163 may include the first groove 163g1 and the second grooves 163g2. The driving voltage line 172 may be disposed within the first groove 163g1 of the third interlayer insulating layer 163. The data lines 171 may be disposed within the second grooves 163g2 of the third interlayer insulating layer 163.

The width Wg1 of the first groove 163g1 of the third interlayer insulating layer 163 may be substantially the same as the width We of the driving voltage line 172. The driving voltage line 172 may fill the first groove 163g1 of the third interlayer insulating layer 163.

The width Wg2 of one second groove 163g2 of the third interlayer insulating layer 163 may be substantially the same as the width Wd of one data line 171. The data line 171 may fill the second groove 163g2 of the third interlayer insulating layer 163.

The second data conductor including the driving voltage line 172 and the data lines 171 may be formed by a photo and etching process. The second data conductor including the driving voltage line 172 and the data lines 171 may be formed by a chemical mechanical polishing (CMP) process. By using the chemical mechanical polishing process, the driving voltage line 172 and the data line 171 may be easily formed to fill the inside of the groove of the third interlayer insulating layer 163.

Figure 16:
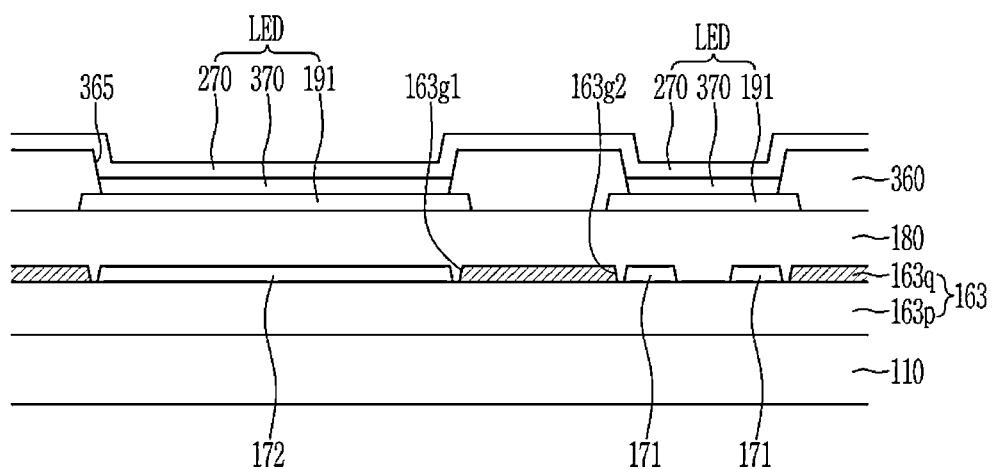
FIG. 16 illustrates a cross-sectional view of a display device according to an embodiment.

FIG. 16 illustrates a cross-sectional view of a display device according to an embodiment. Some elements and/or features associated with FIG. 16 may be analogous to or identical to some elements and/or features described with references to one or more of FIG. 1 to FIG. 15.

As shown in FIG. 16, the display device may include the substrate 110, the pixel electrode 191 disposed on the substrate 110, and the third interlayer insulating layer 163, the data lines 171, the driving voltage line 172, and the passivation layer 180 that are disposed between the substrate 110 and the pixel electrode 191. The data lines 171 and the driving voltage line 172 may be disposed on the third interlayer insulating layer 163, and the passivation layer 180 may be disposed on the data lines 171 and the driving voltage line 172.

The third interlayer insulating layer 163 may include the first groove 163g1 and the second groove 163g2. The driving voltage line 172 may be disposed within the first groove 163g1 of the third interlayer insulating layer 163. The data lines 171 may be disposed within the second groove 163g2 of the third interlayer insulating layer 163.

The third interlayer insulating layer 163 may include a third lower interlayer insulating layer 163p and a third upper interlayer insulating layer 163q. The third upper interlayer insulating layer 163q may be disposed on the third lower interlayer insulating layer 163p. The third lower interlayer insulating layer 163p and the third upper interlayer insulating layer 163q may include the same material or different materials. Bottom surfaces of the first groove 163g1 and the second groove 163g2 may directly contact an upper surface of the third lower interlayer insulating layer 163p. Side surfaces of the first groove 163g1 and the second groove 163g2 may side surfaces of the third upper interlayer insulating layer 163q.

When the third interlayer insulating layer 163 is a single layer, a halftone exposure process may be used to form the grooves 163g1 and 163g2 in the third interlayer insulating layer 163. In this case, an elemental component ratio in the third interlayer insulating layer 163 may be different according to a position in the third interlayer insulating layer 163. Contents of sulfur (S) in the first portion 163a and the second portion 163b of the third interlayer insulating layer 163 disposed below the grooves 163g1 and 163g2 may be smaller than a content of sulfur (S) in the third portion 163c of the third interlayer insulating layer 163. This is because the first portion 163a and the second portion 163b of the third interlayer insulating layer 163 are portions where a halftone exposure process is performed, and sulfur (S) elements are partially decomposed.

When the third interlayer insulating layer 163 includes the third lower interlayer insulating layer 163p and the third upper interlayer insulating layer 163q, the third lower interlayer insulating layer 163p and the third upper interlayer insulating layer 163q may be respectively formed by separate processes. In this case, the elemental component ratio in the third interlayer insulating layer 163 may be substantially consistent. After the third lower interlayer insulating layer 163p is first formed flat, the third upper interlayer insulating layer 163q is formed on the third lower interlayer insulating layer 163p and patterned to form the grooves 163g1 and 163g2. Portions of the third upper interlayer insulating layer 163q may be removed to form the grooves 163g1 and 163g2.

Figure 17:
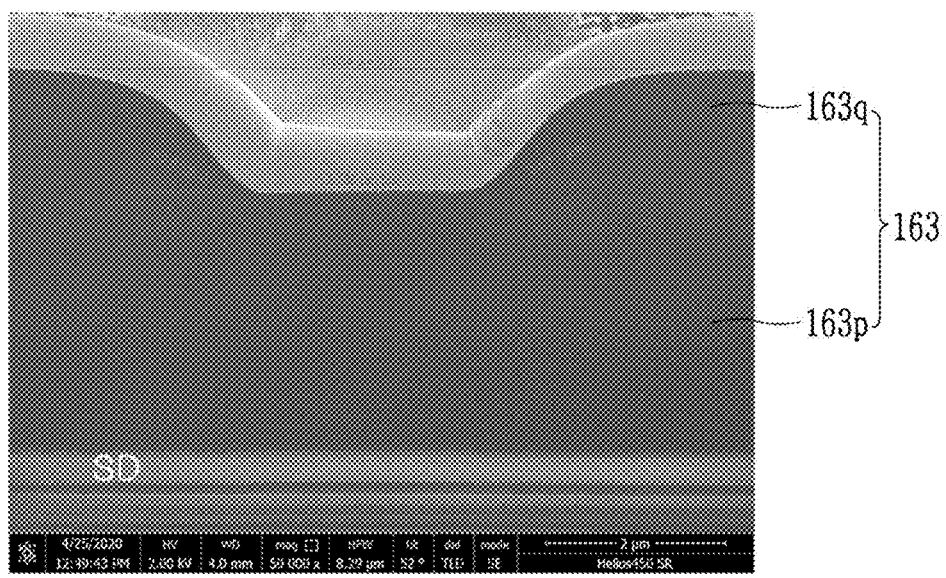
FIG. 17 is a drawing/image of a third interlayer insulating layer of the display device according to the embodiment of FIG. 16.
Figure 18:
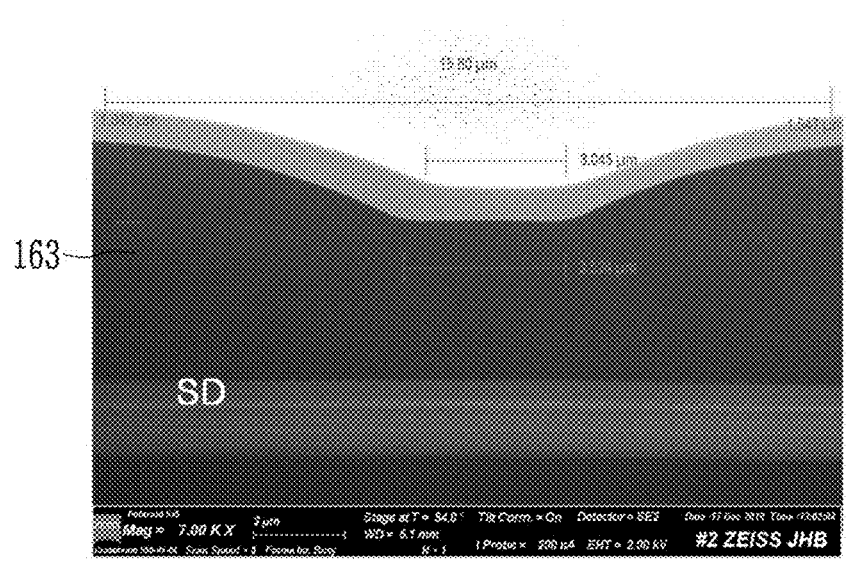
FIG. 18 illustrates a drawing/image of a third interlayer insulating layer of the display device according to the embodiment of FIG. 3.

FIG. 17 illustrates an image the third interlayer insulating layer of the display device of FIG. 16, and FIG. 18 illustrates an image of the third interlayer insulating layer of the display device of FIG. 3.

Referring to FIG. 17, when the third interlayer insulating layer 163 includes two layers, an inclined side surface of the groove may be oriented at an angle in a range of about 40 degrees to 50 degrees relative to the substrate.

Referring to FIG. 18, when the third interlayer insulating layer 163 is a single layer, an inclined side surface of the groove may be oriented at an angle in a range of about 25 degrees to 30 degrees relative to the substrate. If the halftone process is performed, since a portion of a fulltone region is exposed by light diffracted from the halftone region, the angle of the inclined surface may be relatively small.

Figure 19:
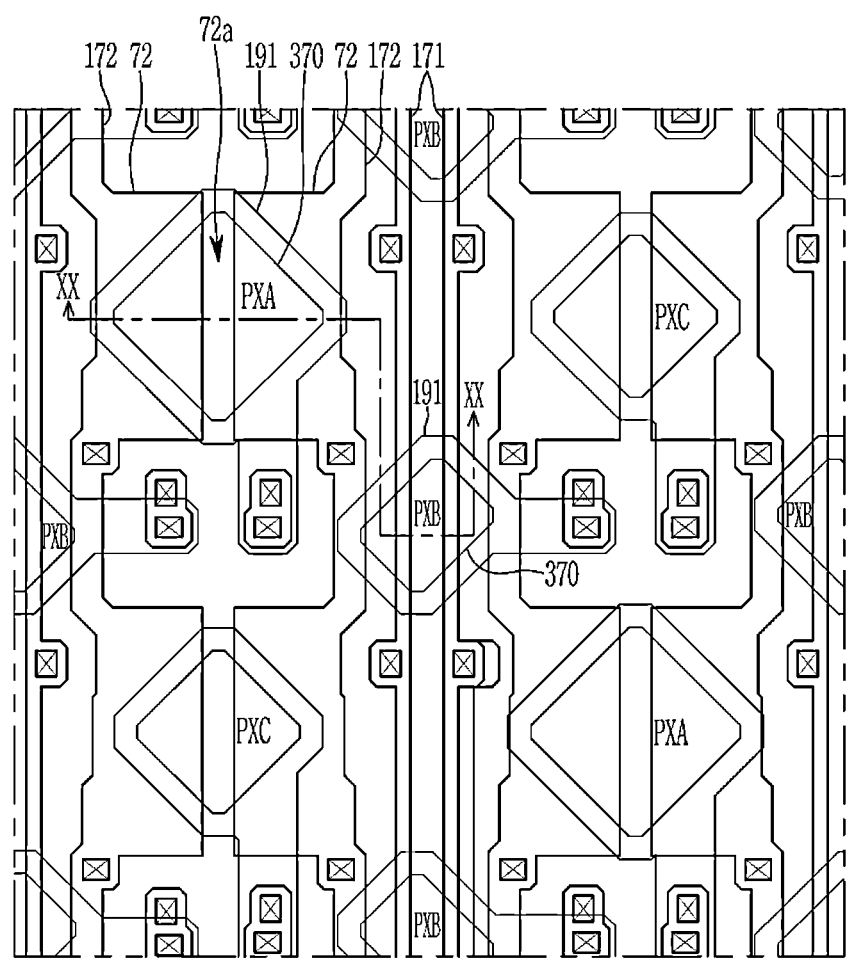
FIG. 19 illustrates a plan view of a display device according to an embodiment.
Figure 20:
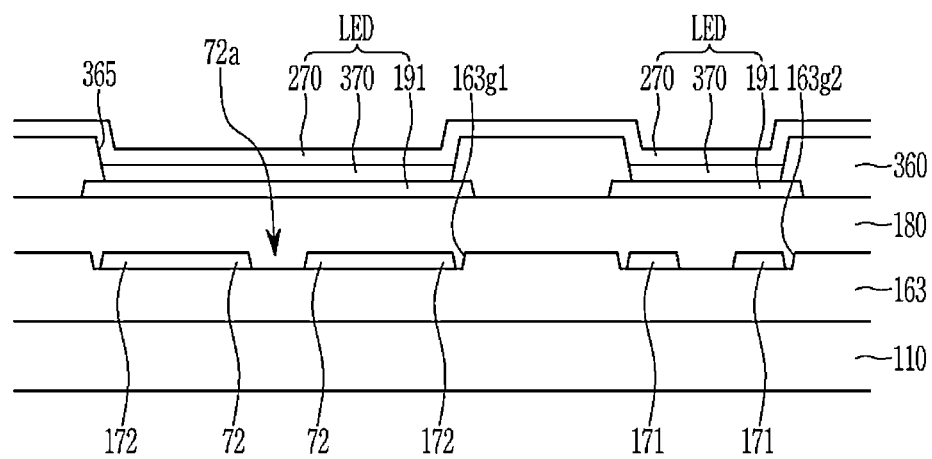
FIG. 20 illustrates a cross-sectional view of a display device taken along line XX-XX of FIG. 19.

FIG. 19 illustrates a plan view of a display device according to an embodiment, and FIG. 20 illustrates a cross-sectional view of a display device taken along line XX-XX of FIG. 19. Some elements and/or features associated with FIG. 19 and FIG. 20 may be analogous to or identical to some elements and/or features described with references to one or more of FIG. 1 to FIG. 18.

As shown in FIG. 19 and FIG. 20, the display device may include the substrate 110, the pixel electrode 191 disposed on the substrate 110, and the third interlayer insulating layer 163, the data lines 171, the driving voltage lines 172, and the passivation layer 180 that are disposed between the substrate 110 and the pixel electrode 191. The data lines 171 and the driving voltage lines 172 may be disposed on the third interlayer insulating layer 163, and the passivation layer 180 may be disposed on the data lines 171 and the driving voltage lines 172.

The third interlayer insulating layer 163 may include the first groove 163g1 and the second groove 163g2. The driving voltage lines 172 may be disposed within the first groove 163g1 of the third interlayer insulating layer 163. The data lines 171 may be disposed within the second groove 163g2 of the third interlayer insulating layer 163.

Two driving voltage lines 172 adjacent to each other may be separated from each other. An opening 72a may be disposed between the adjacent two driving voltage lines 172, and the two driving voltage lines 172 may be spaced apart from each other by the opening 72a.

Each driving voltage line 172 may include an extension 72, and the extensions 72 of the two adjacent driving voltage lines 172 may be separated from each other by the opening 72a. Since the driving voltage line 172 includes the extension 72, a signal delay of a driving voltage may be prevented. The extension 72 may have a relatively large area, such that an internal gas (generated in the baking process for forming insulating layers that are disposed under the driving voltage line 172 and include an organic material) may not be sufficiently discharged to the outside if the opening 72a is not implemented. Since the extensions 72 of the adjacent driving voltage lines 172 are separated from each other by the opening 72a, the internal gas may be effectively discharged to the outside, such that satisfactory reliability and image display quality of the display device may be attained.

A step may occur when the extensions 72 of the adjacent driving voltage lines 172 are separated from each other by the opening 72a. In embodiments, the driving voltage lines 172 are disposed within the first groove 163g1 of the third interlayer insulating layer 163 for preventing such a step. Accordingly, the passivation layer 180 disposed on the third interlayer insulating layer 163 and the driving voltage line 172 may be sufficiently thin and flat.

FIG. 20 illustrates that two adjacent driving voltage lines 172 are disposed within one first groove 163g1. Exactly one driving voltage line 172 may be disposed within one first groove 163g1. In this case, the upper surface of the portion of the third interlayer insulating layer 163 positioned in the opening pattern 72a and the upper surface of the driving voltage line 172 may be substantially coplanar. Accordingly, the upper surface of the passivation layer 180 disposed on the third interlayer insulating layer 163 and the driving voltage line 172 may be sufficiently flat.

Figure 21:
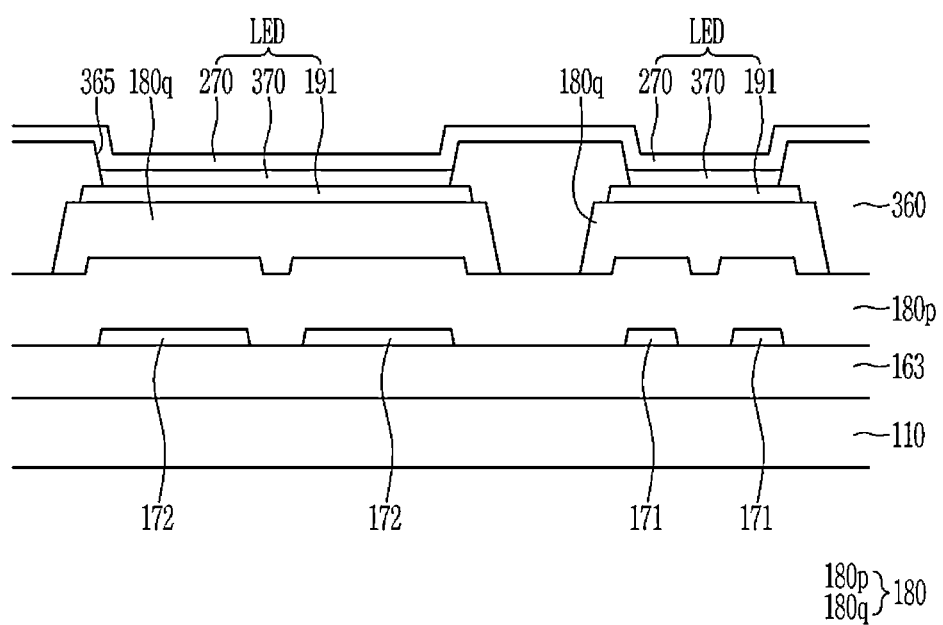
FIG. 21 illustrates a cross-sectional view of a display device according to an embodiment.

FIG. 21 illustrates a cross-sectional view of a display device according to an embodiment. Some elements and/or features associated with FIG. 21 may be analogous to or identical to some elements and/or features described with references to one or more of FIG. 1 to FIG. 20.

As shown in FIG. 21, the display device may include the substrate 110, the pixel electrode 191 disposed on the substrate 110, and the third interlayer insulating layer 163, the data lines 171, the driving voltage lines 172, and the passivation layer 180 that are disposed between the substrate 110 and the pixel electrode 191. The data lines 171 and the driving voltage lines 172 may be disposed on the third interlayer insulating layer 163, and the passivation layer 180 may be disposed on the data lines 171 and the driving voltage lines 172.

The passivation layer 180 may include a first passivation layer 180p and a second passivation layer 180q.

The first passivation layer 180p may be disposed on the data lines 171 and the driving voltage lines 172. The first passivation layer 180p may entirely cover a face of the substrate 110. The second passivation layer 180q may be disposed on the first passivation layer 180p. The second passivation layer 180q may only partially cover the face of the substrate 110. The second passivation layer 180q may overlap the data lines 171 and the driving voltage lines 172. The second passivation layer 180q may overlap the pixel electrode 191. The second passivation layer 180q may overlap an edge of the pixel defining layer 360. The second passivation layer 180q may not overlap a center portion of the pixel defining layer 360. A portion of the second passivation layer 180q that does not overlap the data line 171 and the driving voltage line 172 may be removed.

The first passivation layer 180p and/or the second passivation layer 180q may include an organic insulating material. The first passivation layer 180p and the second passivation layer 180q may include the same material or different materials.

The second passivation layer 180q is disposed on the first passivation layer 180p, and an upper surface of the second passivation layer 180q may be substantially flat. Accordingly, the pixel electrode 191 disposed on the passivation layer 180 may have a flat upper surface, may lower reflectance of external light, and may prevent color bleeding.

The first passivation layer 180p is formed substantially thin, and the second passivation layer 180q is patterned so that it includes openings, thus an internal gas that may occur in the process of forming the insulating layer may be effectively discharged.

By forming the first passivation layer 180p directly on the data lines 171 and the driving voltage lines 172, and by additionally forming the second passivation layer 180q on the first passivation layer 180p, flatness of the upper surface of the passivation layer 180 may be further improved.

In embodiments, the adjacent driving voltage lines 172 may be connected to each other and/or may be integrally formed.

Figure 22:
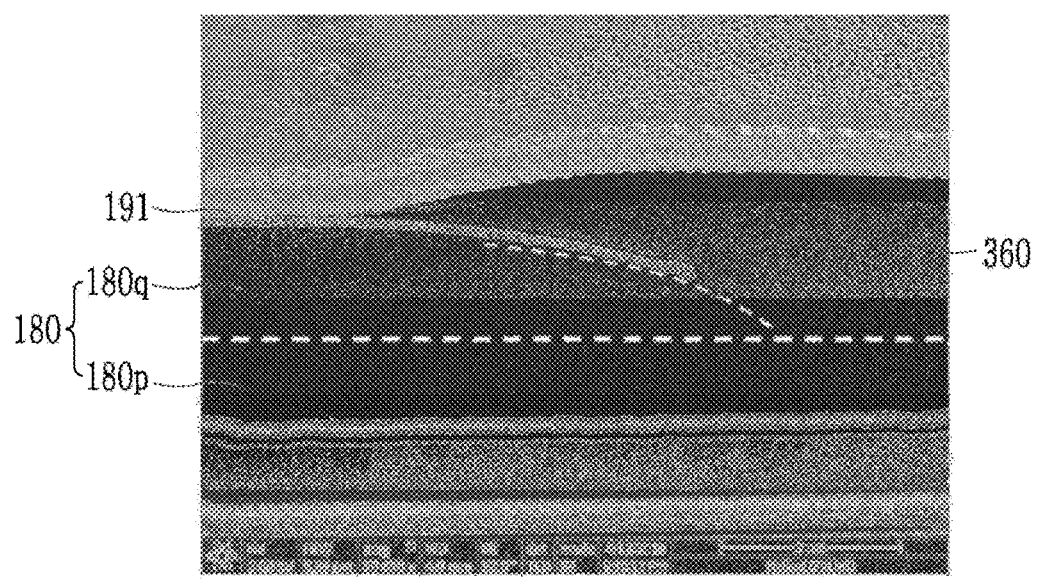
FIG. 22 illustrates a drawing/image of a portion of a display device according to an embodiment.

FIG. 22 illustrates a drawing/image of a portion of a display device according to an embodiment. FIG. 22 illustrates the passivation layer and its surroundings of the display device of FIG. 21.

As shown in FIG. 22, the passivation layer 180 may include the first passivation layer 180p and the second passivation layer 180q. The passivation layer 180 may be formed thin and flat. The second passivation layer 180q is patterned to have at least one opening, and an inclined surface of the opening of the second passivation layer 180q may be smoothly formed.

Figure 23:
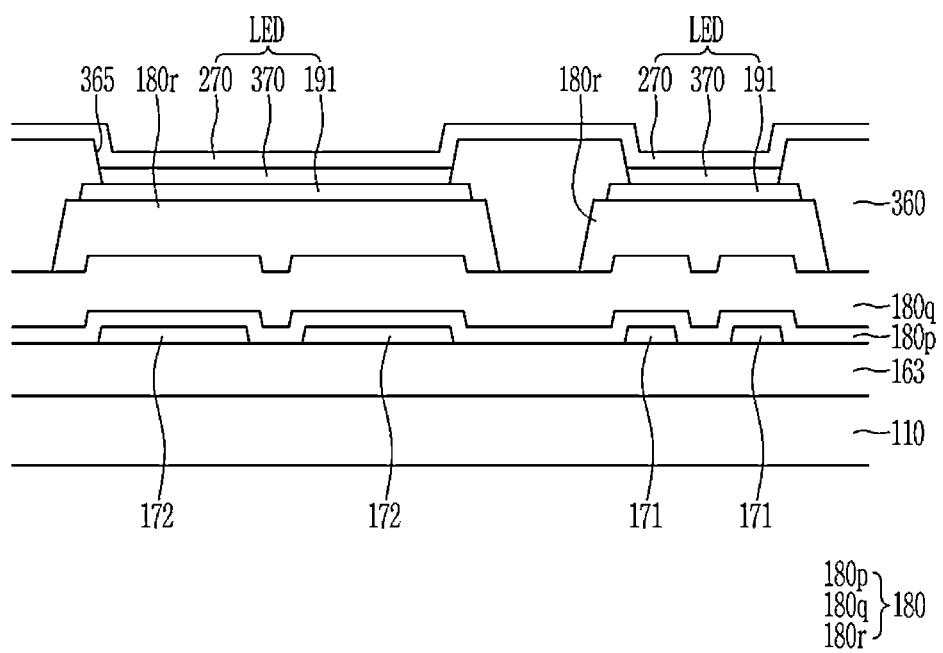
FIG. 23 illustrates a cross-sectional view of a display device according to an embodiment.

FIG. 23 illustrates a cross-sectional view of a display device according to an embodiment. Some elements and/or features associated with FIG. 23 may be analogous to or identical to some elements and/or features described with references to one or more of FIG. 1 to FIG. 22.

As shown in FIG. 23, the display device may include the substrate 110, the pixel electrode 191 disposed on the substrate 110, and the third interlayer insulating layer 163, the data lines 171, the driving voltage lines 172, and the passivation layer 180 that are disposed between the substrate 110 and the pixel electrode 191. The data lines 171 and the driving voltage lines 172 may be disposed on the third interlayer insulating layer 163, and the passivation layer 180 may be disposed on the data lines 171 and the driving voltage lines 172.

The passivation layer 180 may include a first passivation layer 180p, a second passivation layer 180q, and a third passivation layer 180r.

The first passivation layer 180p may be disposed directly on the data line 171 and the driving voltage line 172. The first passivation layer 180p may cover an entire face of the substrate 110. The first passivation layer 180p may include an inorganic insulating material such as a silicon oxide (SiO$_x$), a silicon nitride (SiN$_x$), and a silicon oxynitride (SiO$_x$N$_y$). The second passivation layer 180q may be disposed on the first passivation layer 180p. The second passivation layer 180q may cover the entire face of the substrate 110. The second passivation layer 180q may include an organic insulating material. The third passivation layer 180r may be disposed on the second passivation layer 180q. The third passivation layer 180r may include openings that partially expose the second passivation layer 180q. The third passivation layer 180r may overlap the data lines 171 and the driving voltage lines 172. The third passivation layer 180r may overlap an edge of the pixel defining layer 360. The third passivation layer 180r may not overlap a center portion of the pixel defining layer 360. A portion of the third passivation layer 180r that does not overlap the data line 171 and the driving voltage line 172 may be removed. The third passivation layer 180r may include an organic insulating material.

The second passivation layer 180q is disposed on the first passivation layer 180p, the third passivation layer 180r is disposed on the second passivation layer 180q, and an upper surface of the third passivation layer 180r may be substantially flat. Accordingly, the pixel electrode 191 disposed on the passivation layer 180 may have a flat upper surface, may lower reflectance of external light, and may prevent color bleeding.

The first passivation layer 180p and the second passivation layer 180q are formed substantially thin, and the third passivation layer 180r is patterned to include openings, thus an internal gas that may occur in the process of forming the insulating layer may be effectively discharged.

The third interlayer insulating layer 163 may include one or more grooves, and the data lines 171 and the driving voltage lines 172 may be disposed in the one or more grooves. Accordingly, the passivation layer 180 disposed on the data line 171 and the driving voltage line 172 may be substantially flat. By forming the first passivation layer 180q and the second passivation layer 180q on the data lines 171 and the driving voltage lines 172, and by additionally forming the third passivation layer 180r on the second passivation layer 180q, flatness of the upper surface of the passivation layer 180 may be further improved.

FIG. 23 illustrates the structure in which the adjacent driving voltage lines 172 are separated from each other. The adjacent driving voltage lines 172 may be connected to each other and/or may be integrally formed.

Figure 24:
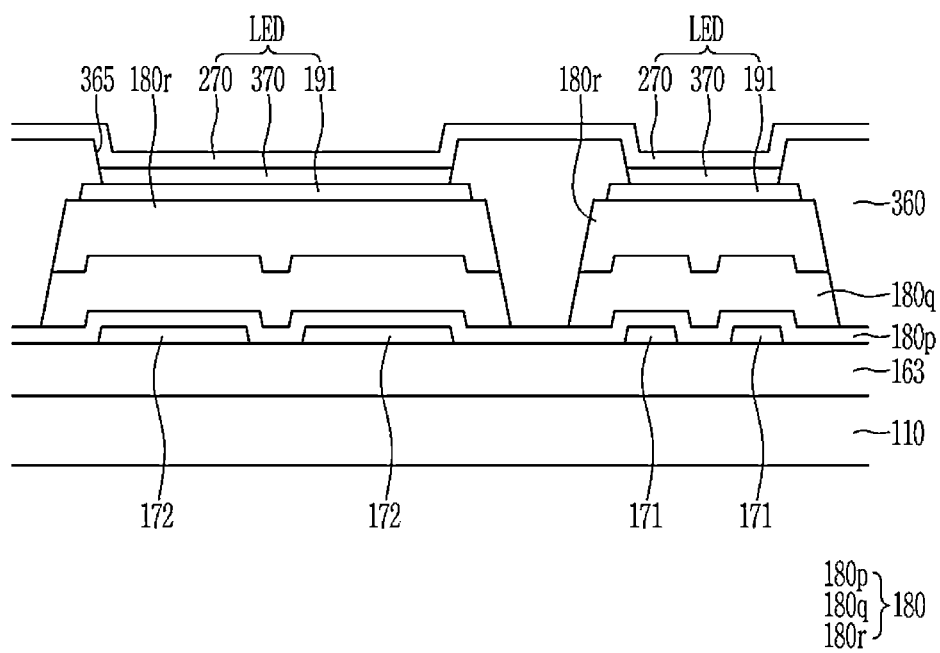
FIG. 24 illustrates a cross-sectional view of a display device according to an embodiment.

FIG. 24 illustrates a cross-sectional view of a display device according to an embodiment. Some elements and/or features associated with FIG. 24 may be analogous to or identical to some elements and/or features described with references to one or more of FIG. 1 to FIG. 23.

As shown in FIG. 24, the display device may include the substrate 110, the pixel electrode 191 disposed on the substrate 110, and the third interlayer insulating layer 163, the data lines 171, the driving voltage lines 172, and the passivation layer 180 that are disposed between the substrate 110 and the pixel electrode 191. The data lines 171 and the driving voltage lines 172 may be disposed on the third interlayer insulating layer 163, and the passivation layer 180 may be disposed on the data lines 171 and the driving voltage lines 172. The passivation layer 180 may include the first passivation layer 180p, the second passivation layer 180q, and the third passivation layer 180r.

The second passivation layer 180q may include openings that partially expose the first passivation layer 180p. The second passivation layer 180q may overlap the data line 171 and the driving voltage line 172. The second passivation layer 180q may overlap the pixel electrode 191. The second passivation layer 180q may overlap an edge of the pixel defining layer 360. The second passivation layer 180q may not overlap a center portion of the pixel defining layer 360. A portion of the second passivation layer 180q that does not overlap the data line 171 and the driving voltage line 172 may be removed. The second passivation layer 180q and the third passivation layer 180r may be patterned using the same mask, may be simultaneously patterned in the same process, and may have substantially the same shape in a plan view of the display device.

Figure 25:
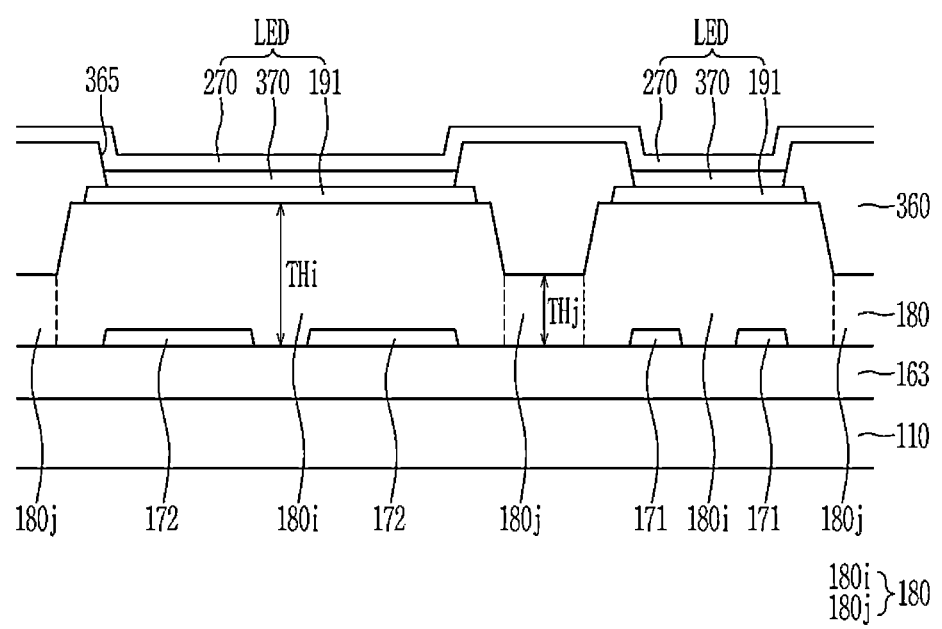
FIG. 25 illustrates a cross-sectional view of a display device according to an embodiment.

FIG. 25 illustrates a cross-sectional view of a display device according to an embodiment. Some elements and/or features associated with FIG. 25 may be analogous to or identical to some elements and/or features described with references to one or more of FIG. 1 to FIG. 24.

As shown in FIG. 25, the display device may include the substrate 110, the pixel electrode 191 disposed on the substrate 110, and the third interlayer insulating layer 163, the data lines 171, the driving voltage lines 172, and the passivation layer 180 that are disposed between the substrate 110 and the pixel electrode 191. The data lines 171 and the driving voltage lines 172 may be disposed on the third interlayer insulating layer 163, and the passivation layer 180 may be disposed on the data lines 171 and the driving voltage lines 172.

The passivation layer 180 may have different thicknesses according to positions along the third interlayer insulating layer 163.

The passivation layer 180 may include a first portion 180*i* having a first thickness THi and may include a second portion 180*j* having a second thickness THj. The first thickness THi of the first portion 180*i* of the passivation layer 180 may be greater than the second thickness THj of the second portion 180*j* of the passivation layer 180. The first portion 180*i* of the passivation layer 180 may overlap the data lines 171 and/or the driving voltage lines 172. The first portion 180*i* of the passivation layer 180 may overlap an edge of a section of the pixel defining layer 360. The first portion 180*i* of the passivation layer 180 may not overlap a center portion of the section of the pixel defining layer 360. The second portion 180*j* of the passivation layer 180 may overlap the center portion of the section of the pixel defining layer 360. The second portion 180*j* of the passivation layer 180 may not overlap the data lines 171 and may not overlap the driving voltage lines 172. The passivation layer 180 may be formed using a halftone exposure process, and the second portion 180*j* may be patterned to be thinner than the first portion 180*i*.

The third interlayer insulating layer 163 may not need to include grooves. The third interlayer insulating layer 163 may be substantially flat, and the data lines 171 and the driving voltage lines 172 are disposed on the third interlayer insulating layer 163. Therefore, an upper surface of the passivation layer 180 disposed on the data line 171 and the driving voltage line 172 may not be flat if the first portion 180*i* is not sufficiently thick. In embodiments, the first portion 180*i* of the passivation layer 180 overlapping the data lines 171 and/or the driving voltage lines 172 has a sufficient thickness, and thus an upper surface of the first portion 180*i* of the passivation layer 180 may be substantially flat. Since the pixel electrode 191 is disposed on the first portion 180*i* of the passivation layer 180, it may have a flat upper surface, may lower reflectance of external light, and may prevent color bleeding.

Since the second portion 180*j* of the passivation layer 180 is sufficiently thin, an internal gas that may occur in the process of forming the insulating layer may be effectively discharged.

The third interlayer insulating layer 163 may include no groove. The third interlayer insulating layer 163 may include one or more grooves, and the data lines 171 and/or the driving voltage lines 172 may be disposed in the one or more grooves. Accordingly, the passivation layer 180 disposed on the data line 171 and the driving voltage line 172 may be substantially flat. By forming the first portion 180*i* (which overlaps the data lines 171 and/or the driving voltage lines 172) to be relatively thick, flatness of the upper surface of the passivation layer 180 may be further improved.

FIG. 25 illustrates the structure in which the adjacent driving voltage lines 172 are separated from each other. The adjacent driving voltage lines 172 may be connected to each other and/or may be integrally formed.

While example embodiments have been described, practical embodiments cover various modifications and equivalent arrangements within the scope of the appended claims.

What is claimed is:

1. A display device comprising:
a substrate;
a transistor overlapping the substrate and comprising a semiconductor layer, a source electrode or a drain electrode, wherein the source electrode or the drain electrode directly contacts the semiconductor layer;
an interlayer insulating layer overlapping the transistor and including a first groove and a second groove;
a first conductive line electrically connected to the transistor, disposed on the interlayer insulating layer and at least partially disposed inside the first groove, the interlayer insulating layer overlapping the source electrode or the drain electrode of the transistor;
a first data line electrically connected to the transistor, disposed on the interlayer insulating layer and at least partially disposed inside the second groove, the interlayer insulating layer overlapping the source electrode or the drain electrode of the transistor;
a pixel electrode electrically connected to the first conductive line through the transistor and overlapping the first conductive line;
a passivation layer disposed between the pixel electrode and the first conductive line and directly contacting at least one of the pixel electrode and the first conductive line;
a common electrode overlapping the pixel electrode; and
a light emitting element layer disposed between the common electrode and the pixel electrode,
wherein the interlayer insulating layer includes a first portion overlapping the first conductive line and a second portion excluding the first portion, and
a thickness of the first portion is less than a thickness of the second portion, and
wherein the passivation layer is in a direct contact with a part of the first groove and the second groove.

2. The display device of claim 1, wherein
the first conducive line is a driving voltage line.

3. The display device of claim 2, wherein
a depth of the first groove is equal to a thickness of the driving voltage line in a thickness direction of the driving voltage line, and
a depth of the second groove is equal to a thickness of the first data line in a thickness direction of the first data line.

4. The display device of claim 2, wherein
a width of the first groove is greater than or equal to a width of the driving voltage line in a cross section of the display device, and
a width of the second groove is greater than or equal to a width of the first data line in the cross section of the display device.

5. The display device of claim 2, further comprising a second data line, wherein
the second data line is spaced from the first data line and is at least partially disposed inside the second groove.

6. The display device of claim 2, wherein
exactly one data line is disposed in the second groove.

7. The display device of claim 1, wherein
the interlayer insulating layer includes a first insulating layer and a second insulating layer,
the first insulating layer is disposed between the second insulating layer and the substrate, and the first conductive line directly contacts a face of the first insulating layer and is disposed between two sections of the second insulating layer.

8. The display device of claim 7, wherein the face of the first insulating layer directly contacts the two sections of the second insulating layer.

9. The display device of claim 1, further comprising a driving voltage line, wherein the driving voltage line is spaced from the first conductive line and is at least partially disposed inside the first groove.

10. The display device of claim 1, further comprising:
an encapsulation layer overlapping the common electrode;
a light blocking layer overlapping the encapsulation layer; and
a color filter overlapping the pixel electrode and directly contacting the light blocking layer.

11. The display device of claim 1, wherein the semiconductor layer of the transistor is composed of at least one of an oxide semiconductor and a polycrystalline semiconductor.

\* \* \* \* \*